United States Patent
Wu et al.

(10) Patent No.: US 12,237,228 B2
(45) Date of Patent: *Feb. 25, 2025

(54) SEMICONDUCTOR DEVICE AND METHOD

(71) Applicant: Taiwan Semiconductor Manufacturing Co., Ltd., Hsinchu (TW)

(72) Inventors: Shao-Jyun Wu, New Taipei (TW); Hung-Chi Wu, Hsinchu (TW); Chia-Ching Lee, New Taipei (TW); Pin-Hsuan Yeh, Taipei (TW); Hung-Chin Chung, Pingzhen (TW); Hsien-Ming Lee, Changhua (TW); Chien-Hao Chen, Chuangwei Township (TW); Sheng-Liang Pan, Hsinchu (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/345,148

(22) Filed: Jun. 30, 2023

(65) Prior Publication Data

US 2023/0343648 A1    Oct. 26, 2023

Related U.S. Application Data

(63) Continuation of application No. 17/391,220, filed on Aug. 2, 2021, now Pat. No. 11,735,481, which is a
(Continued)

(51) Int. Cl.
*H01L 21/02* (2006.01)
*H01L 21/8234* (2006.01)
(Continued)

(52) U.S. Cl.
CPC .. *H01L 21/823431* (2013.01); *H01L 21/0234* (2013.01); *H01L 29/41791* (2013.01); *H01L 29/66795* (2013.01); *H01L 29/785* (2013.01)

(58) Field of Classification Search
CPC ......... H01L 29/66871; H01L 29/66606; H01L 29/66545; H01L 21/0234; H01L 21/02337;
(Continued)

(56) References Cited

U.S. PATENT DOCUMENTS

| 10,535,524 B1 * | 1/2020 | Wu ................. H01L 21/28176 |
| 2004/0011764 A1 * | 1/2004 | De Vries ........... H01J 37/32009 216/63 |

(Continued)

FOREIGN PATENT DOCUMENTS

| CN | 109860055 A | 6/2019 |
| CN | 112490191 A | 3/2021 |

*Primary Examiner* — Jarrett J Stark
(74) *Attorney, Agent, or Firm* — Slater Matsil, LLP

(57) ABSTRACT

An improved work function layer and a method of forming the same are disclosed. In an embodiment, the method includes forming a semiconductor fin extending from a substrate; depositing a dielectric layer over the semiconductor fin; depositing a first work function layer over the dielectric layer; and exposing the first work function layer to a metastable plasma of a first reaction gas, a metastable plasma of a generation gas, and a metastable plasma of a second reaction gas, the first reaction gas being different from the second reaction gas.

20 Claims, 27 Drawing Sheets

Related U.S. Application Data continuation of application No. 16/568,518, filed on Sep. 12, 2019, now Pat. No. 11,081,396.

(51) Int. Cl.
  *H01L 29/417* (2006.01)
  *H01L 29/66* (2006.01)
  *H01L 29/78* (2006.01)

(58) Field of Classification Search
  CPC ....... H01L 21/02318; H01L 21/823431; H01L 29/41791; H01L 29/66795; H01L 29/785; H01L 21/321; H01L 21/32139; H01L 21/3215; H01L 21/823821; H01L 21/28088; H01L 21/823828; H01L 27/0924; H01L 29/4966; H01J 37/32357; H01J 37/32422
  See application file for complete search history.

(56) References Cited

U.S. PATENT DOCUMENTS

| | | | |
|---|---|---|---|
| 2008/0090354 A1* | 4/2008 | Baek | H01L 29/40114 257/E21.409 |
| 2011/0128667 A1* | 6/2011 | Do | H01L 29/4966 438/653 |
| 2011/0248348 A1 | 10/2011 | Gan et al. | |
| 2012/0069632 A1* | 3/2012 | Hayakawa | H10B 63/20 257/E47.001 |
| 2012/0153275 A1* | 6/2012 | Endo | H01L 29/42384 257/43 |
| 2013/0207087 A1* | 8/2013 | Kim | H10K 59/123 438/23 |
| 2016/0020118 A1 | 1/2016 | Park et al. | |
| 2016/0163509 A1* | 6/2016 | Koo | C23C 16/513 250/492.1 |
| 2016/0336194 A1* | 11/2016 | Yeh | H01L 29/66545 |
| 2016/0343706 A1 | 11/2016 | Chang et al. | |
| 2017/0117190 A1* | 4/2017 | Chung | H01L 29/4966 |
| 2017/0330952 A1* | 11/2017 | Su | H01L 29/66553 |
| 2018/0174845 A1* | 6/2018 | Jang | H01L 29/4966 |
| 2018/0174870 A1 | 6/2018 | Yang et al. | |
| 2019/0067278 A1* | 2/2019 | Seo | H01L 29/4236 |
| 2019/0164758 A1* | 5/2019 | Su | H01L 21/3105 |
| 2019/0165123 A1 | 5/2019 | Lo et al. | |
| 2019/0198498 A1* | 6/2019 | Park | H01L 29/4908 |
| 2020/0127089 A1* | 4/2020 | Hsu | H01L 29/66575 |
| 2021/0082768 A1* | 3/2021 | Wu | H01L 29/66795 |

* cited by examiner

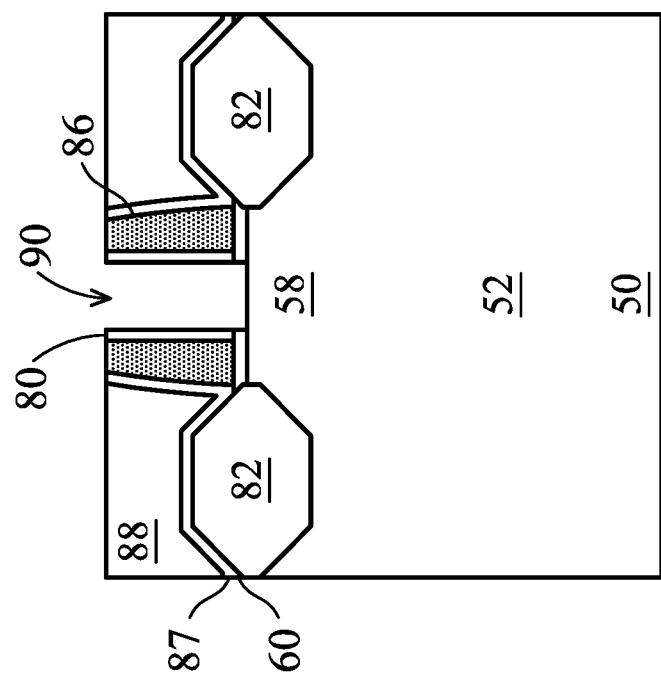
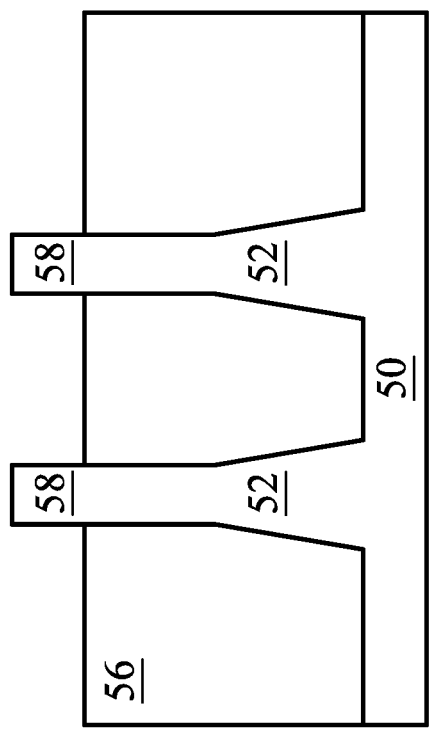
Figure 13B
Figure 13A

SEMICONDUCTOR DEVICE AND METHOD

PRIORITY CLAIM AND CROSS-REFERENCE

This application is a continuation of U.S. patent application Ser. No. 17/391,220, filed on Aug. 2, 2021, and entitled "Semiconductor Device and Method," which is a continuation of U.S. patent application Ser. No. 16/568,518, filed on Sep. 12, 2019 (now U.S. Pat. No. 11,081,396, issuing Aug. 3, 2021), and entitled "Semiconductor Device and Method," each application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14, and 15 are cross-sectional views of intermediate stages in the manufacturing of FinFETs, in accordance with some embodiments.

DETAILED DESCRIPTION

Figure 1:
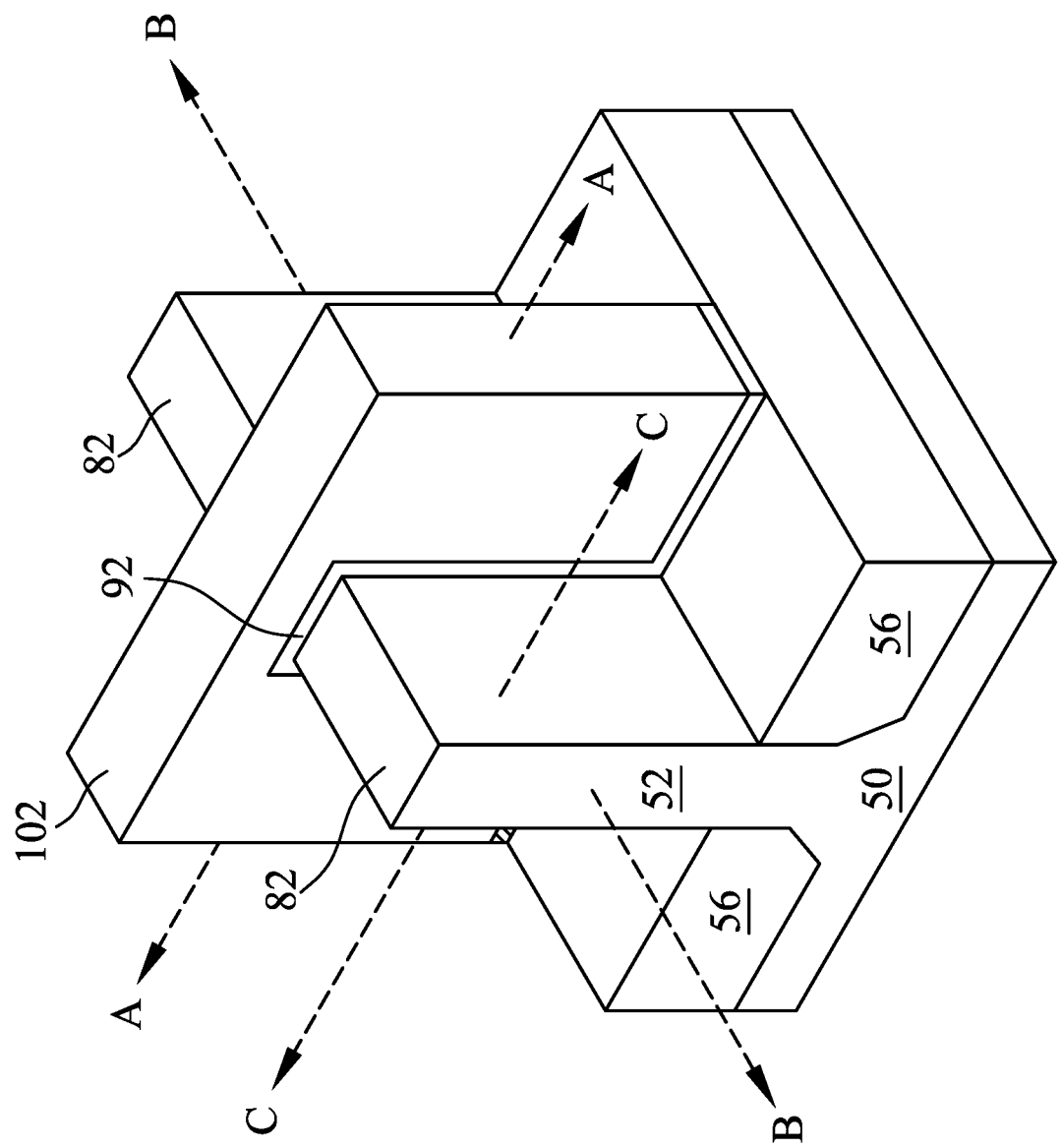
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved work function layers in semiconductor devices, semiconductor devices including the improved work function layers, and an apparatus for performing a plasma treatment on the work function layers to form the improved work function layers. For example, a dielectric layer may be deposited over a semiconductor fin and a work function layer may be deposited over the dielectric layer. In some embodiments, the work function layer may comprise tungsten carbon nitride (WCN). The plasma treatment may include exposing the work function layer a plasma generated from helium, nitrogen, and hydrogen gases. Performing the plasma treatment on the work function layer may increase the density of the work function layer, reduce grain size in the work function layer, reduce the concentration of carbon in the work function layer, and increase the concentrations of nitrogen and tungsten in the work function layer. The exposure of the work function layer to the plasma may further improve adhesion of a subsequently deposited photoresist material, such as a bottom anti-reflective coating (BARC) layer, to the work function layer. Exposing the work function layer to the plasma may improve patterning accuracy of the work function layer, improve device performance for devices including the work function layer, reduce defects in devices including the work function layer, and increase passing rates of wafer acceptance testing (WAT), increasing yield.

FIG. 1 illustrates an example of a fin field-effect transistor (FinFET) in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 and the substrate 50 are illustrated as being formed of a single, continuous material, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 102 is over the gate dielectric layer 92. Source/drain regions 82 are disposed in opposite sides of the fin 52 with respect to the gate dielectric layer 92 and the gate electrode 102. FIG. 1 further illustrates reference cross-sections that are used in later figures. Cross-section A-A is along a longitudinal axis of the gate electrode 102 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 15 and 17 through 23B are cross-sectional views of intermediate stages in the manufacturing of FinFETs, in accordance with some embodiments. FIGS. 2 through 7, 8A, 9A, 10A, 11A, 12A, 13A, 14, 15, 17, 18, 19A, 20, 21A, 22A, and 23A illustrate reference cross-section A-A illustrated in FIG. 1, except for multiple fins/FinFETs. FIGS. 8B, 9B, 10B, 11B, 12B, 13B, 19B, 19C, 21B, 21C, 22B, and 23B are illustrated along reference cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
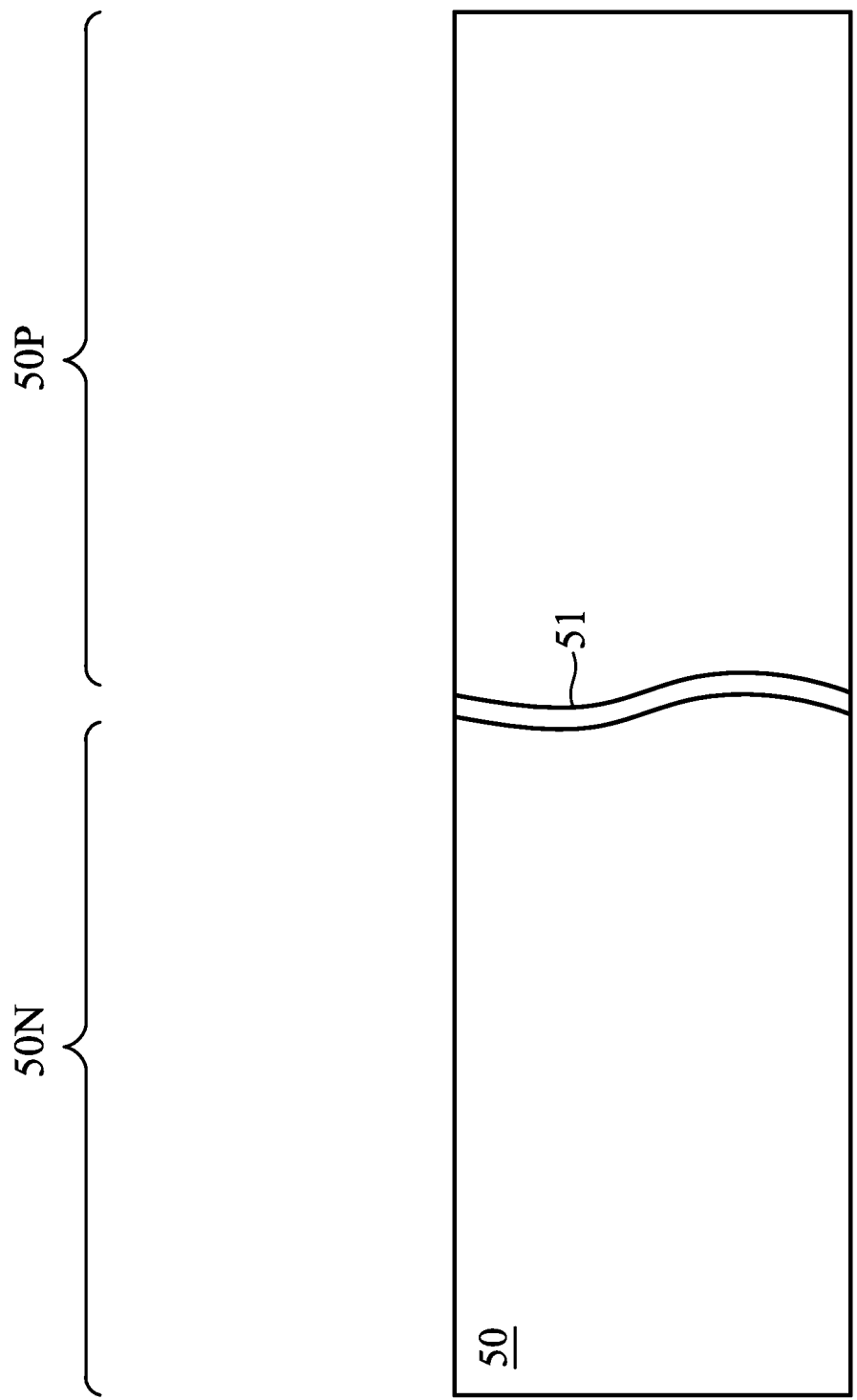

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N may be a region for forming n-type devices, such as NMOS transistors (e.g., n-type FinFETs). The region 50P may be a region for forming p-type devices, such as PMOS transistors (e.g., p-type FinFETs). The region 50N may be physically separated from the region 50P (as illustrated by divider 51), and any number of device features (e.g., other active devices, doped regions, isolation structures, or the like) may be disposed between the region 50N and the region 50P.

Figure 3:
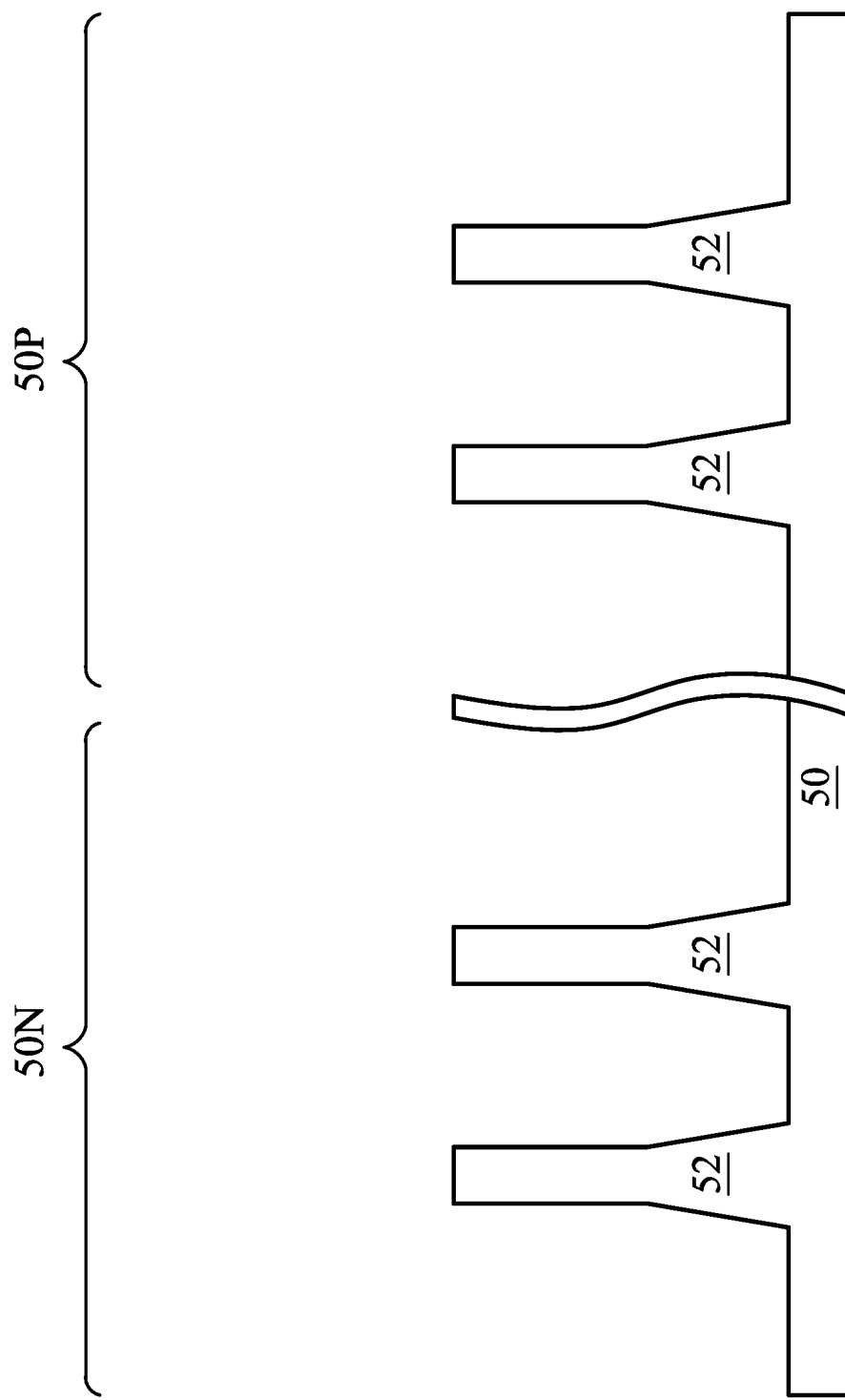

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
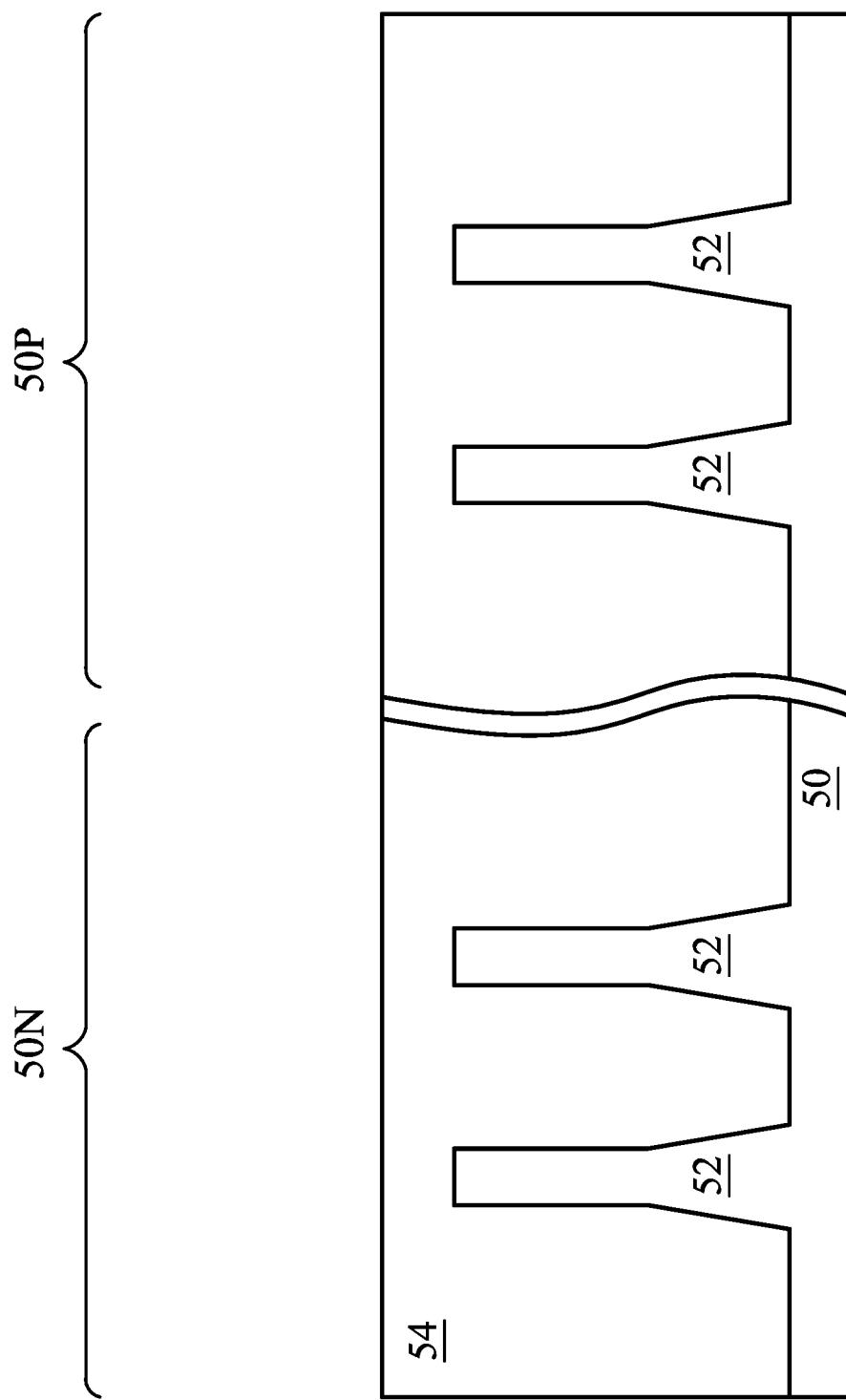

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing convert the material to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as those discussed above may be formed over the liner.

Figure 5:
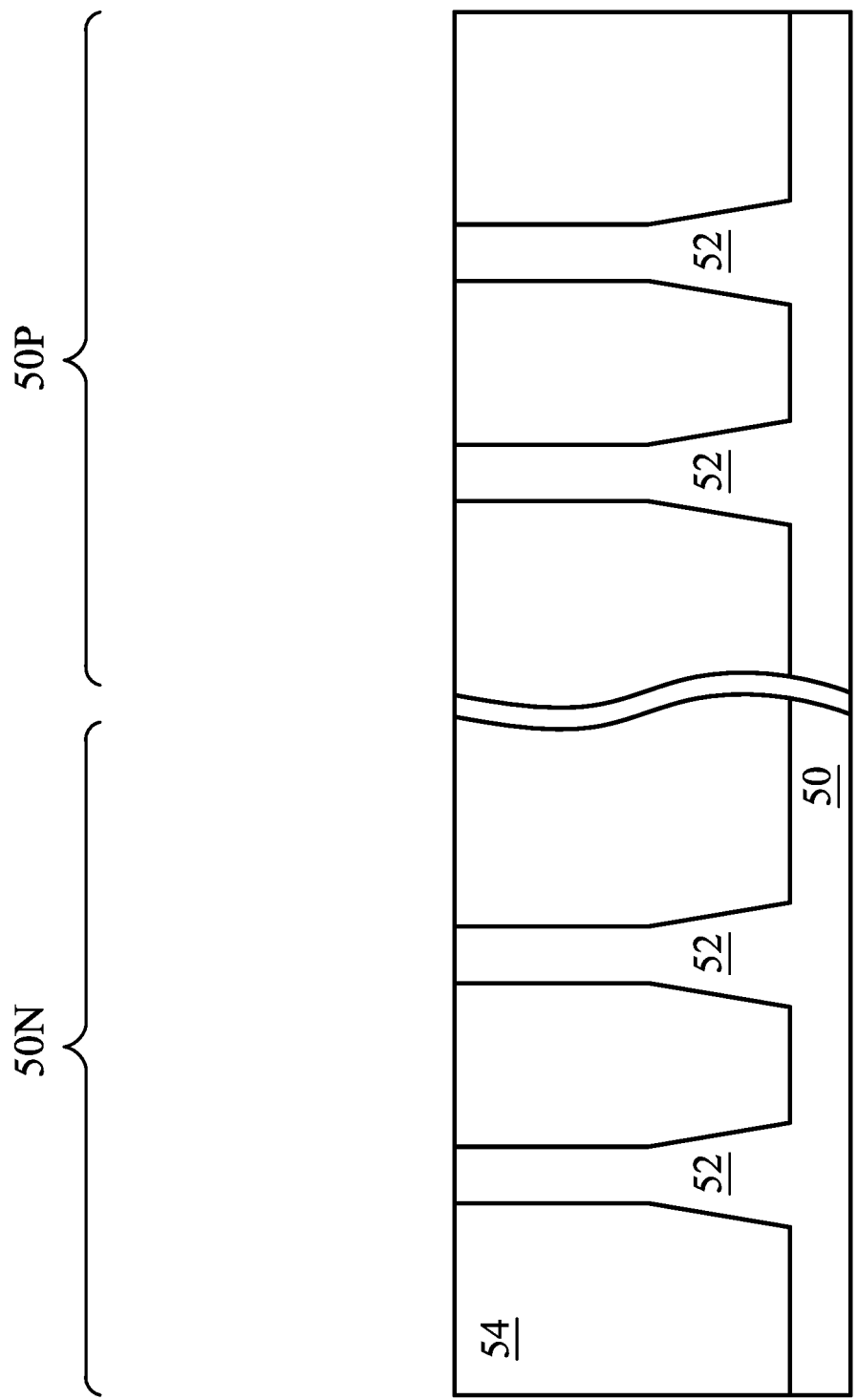

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
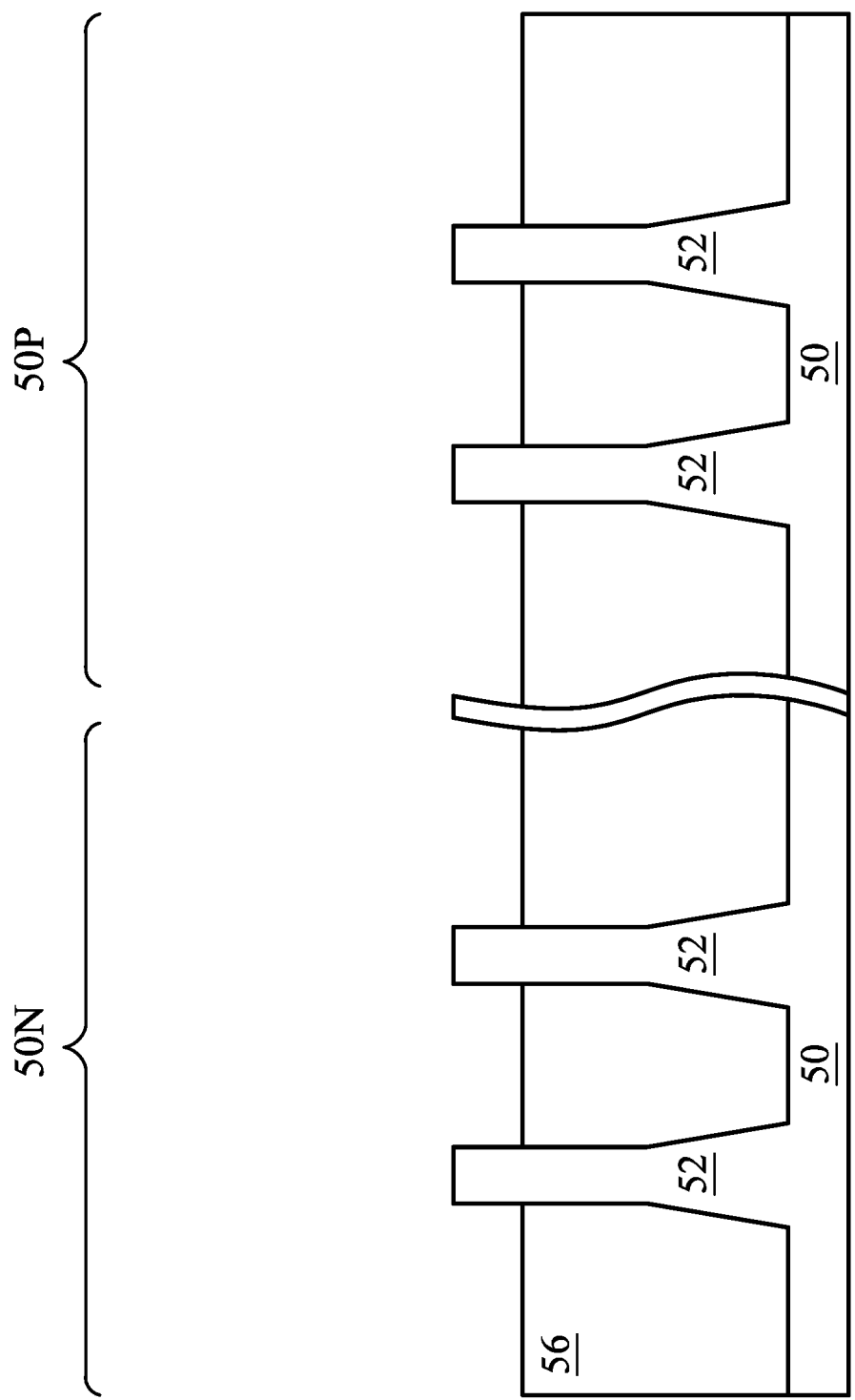

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dished surface), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., an etching process which etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer may be formed over a top surface of the substrate 50, and trenches may be etched through the dielectric layer to expose the underlying substrate 50. Homoepitaxial structures may be epitaxially grown in the trenches, and the dielectric layer may be recessed such that the homoepitaxial structures protrude from the dielectric layer to form fins. Additionally, in some embodiments, heteroepitaxial structures may be used for the fins 52. For example, the fins 52 in FIG. 5 may be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming the III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P of the substrate 50 (e.g., the PMOS region). The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted into the region 50N (e.g., the NMOS region). The n-type impurities may be phosphorus, arsenic, antimony, or the like implanted in the region to a concentration of equal to or less than $10^{18}$ atoms/cm$^3$, such as between about $10^{16}$ atoms/cm$^3$ and about $10^{18}$ atoms/cm$^3$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50 (e.g., the NMOS region). The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P (e.g., the PMOS region). The p-type impurities may be boron, boron fluoride, indium, or the like implanted in the region to a concentration of equal to or less than $10^{18}$ atoms/cm$^3$, such as between about $10^{16}$ atoms/cm$^3$ and about $10^{18}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
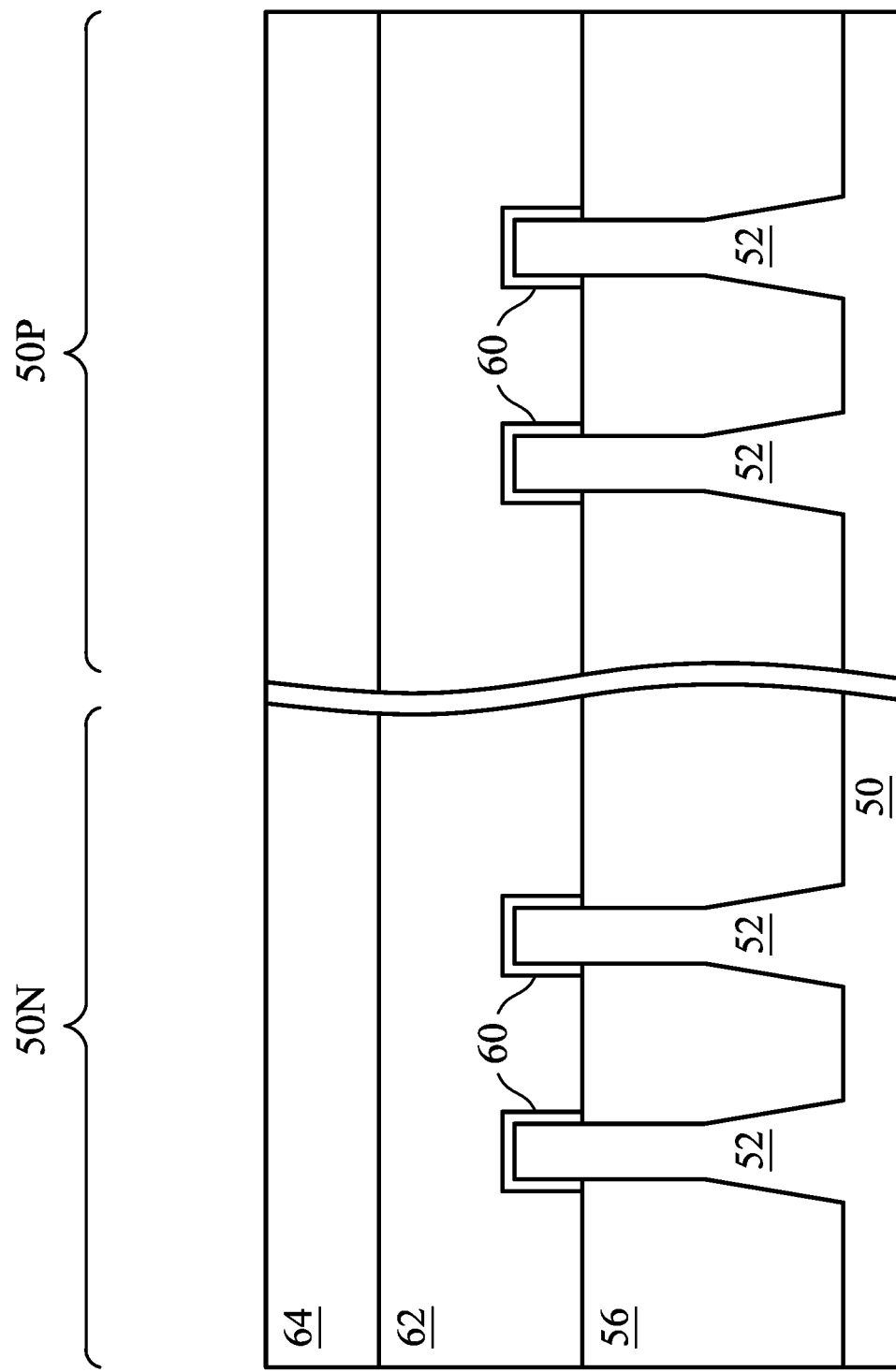

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or the like. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 13B illustrate various additional steps in the manufacturing of embodiment devices. FIGS. 8A through 13B illustrate features in either of the region 50N and the region 50P. For example, the structures illustrated in FIGS. 8A through 13B may be applicable to both the region 50N and the region 50P. Differences (if any) in the structures of the region 50N and the region 50P are described in the text accompanying each figure.

Figure 8B:
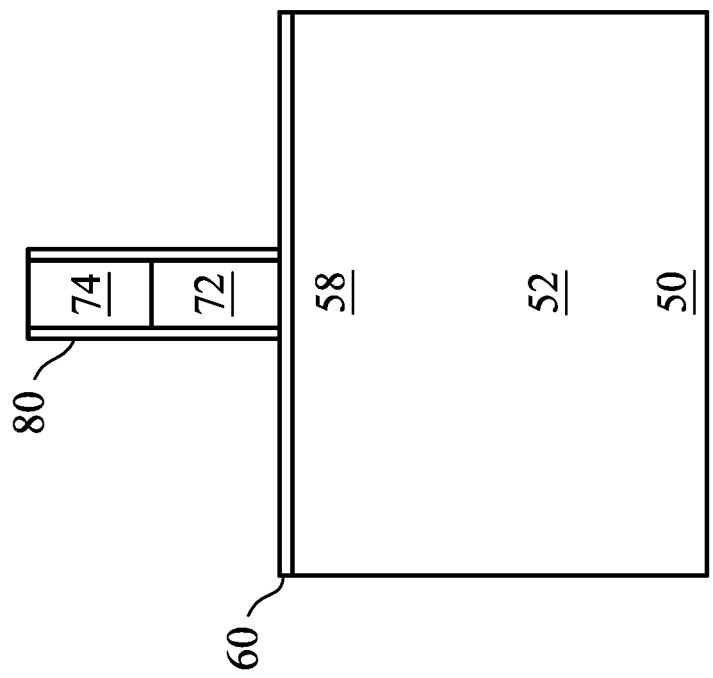
Figure 8A:
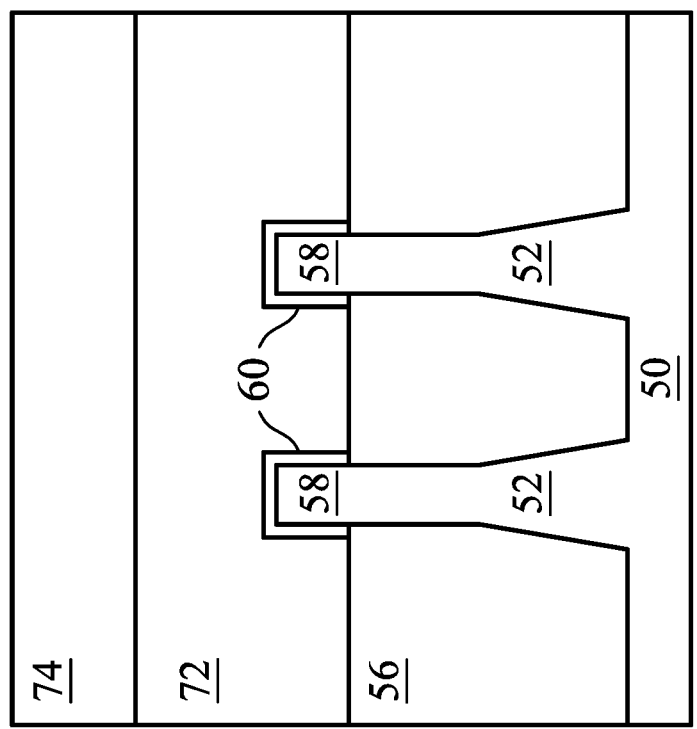

In FIGS. 8A and 8B, the mask layer 64 (see FIG. 7) may be patterned using acceptable photolithography and etching techniques to form masks 74. The pattern of the masks 74 then may be transferred to the dummy gate layer 62 by an acceptable etching technique to form dummy gates 72. In some embodiments (not separately illustrated), the pattern of the masks 74 may also be transferred to the dummy dielectric layer 60. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective fins 52.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may be used to form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

Figure 9B:
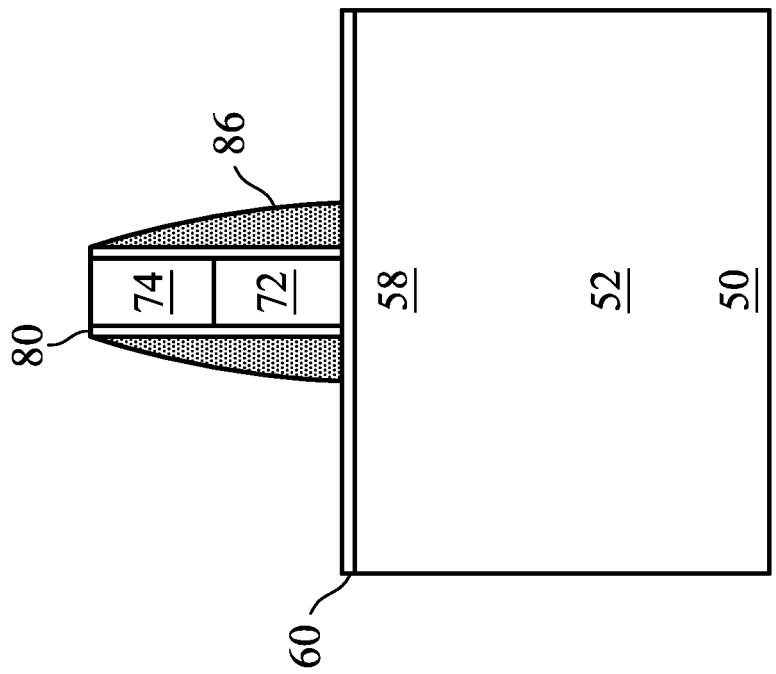
Figure 9A:
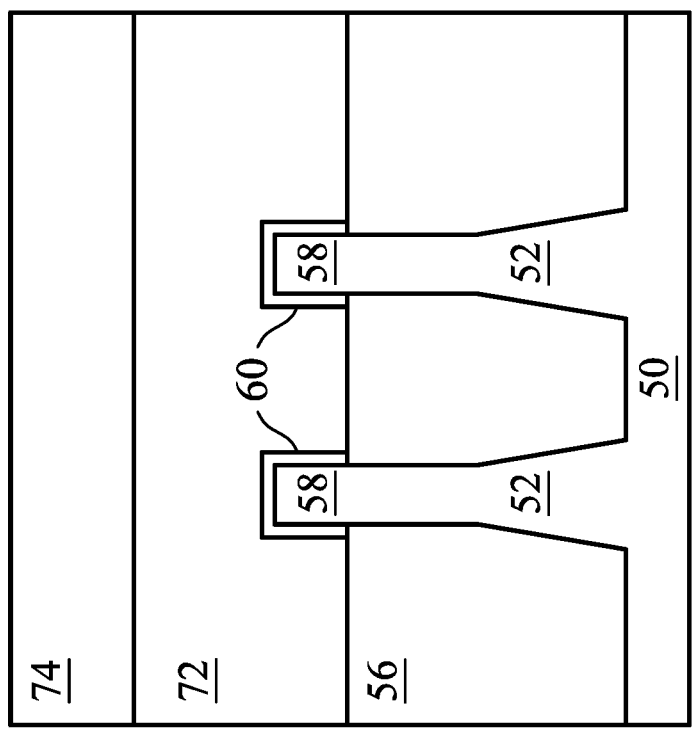

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequences of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
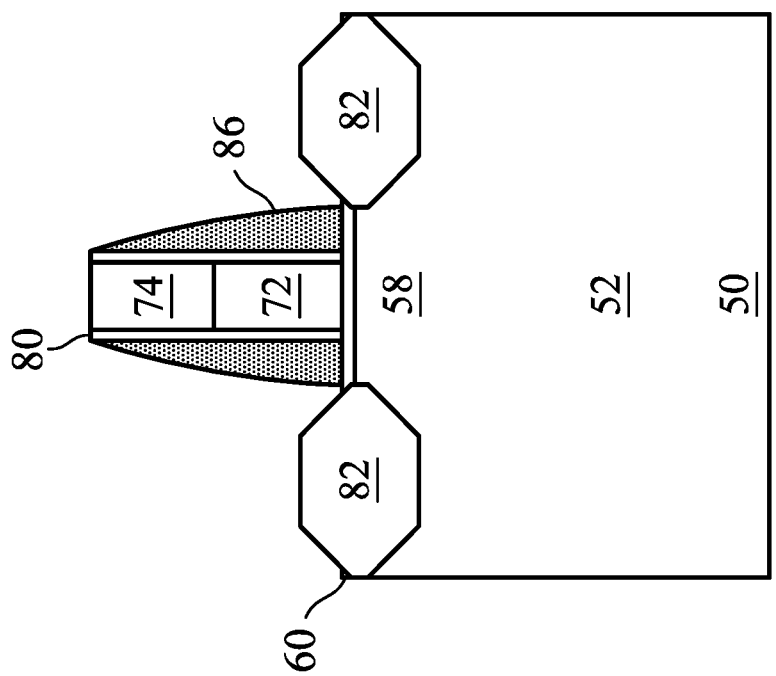
Figure 10A:
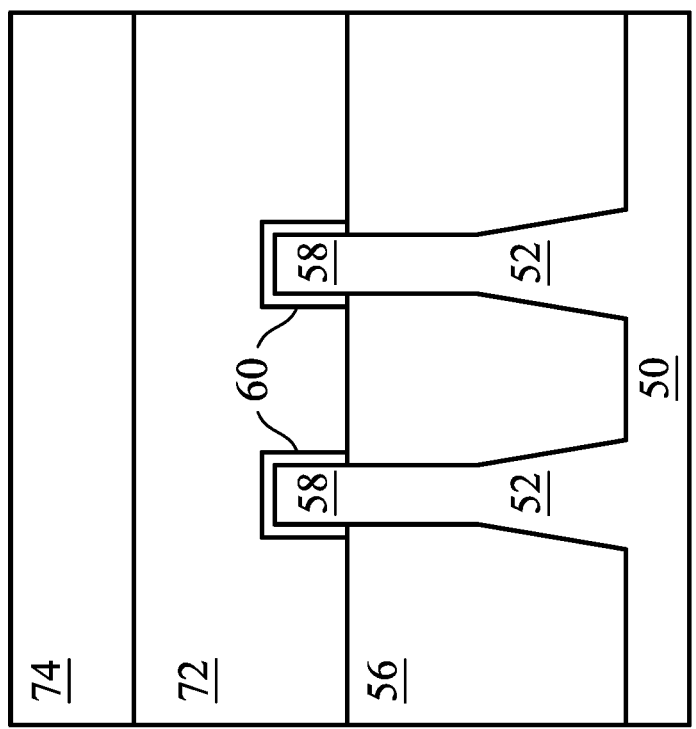
Figure 10C:
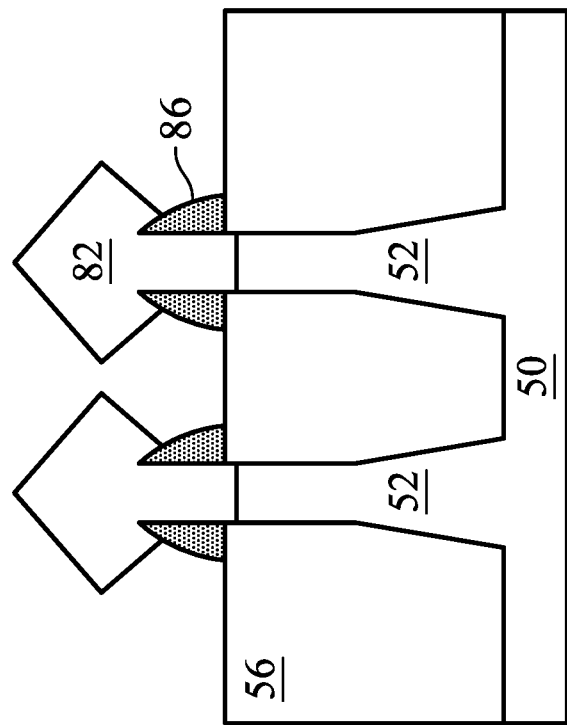
Figure 10D:
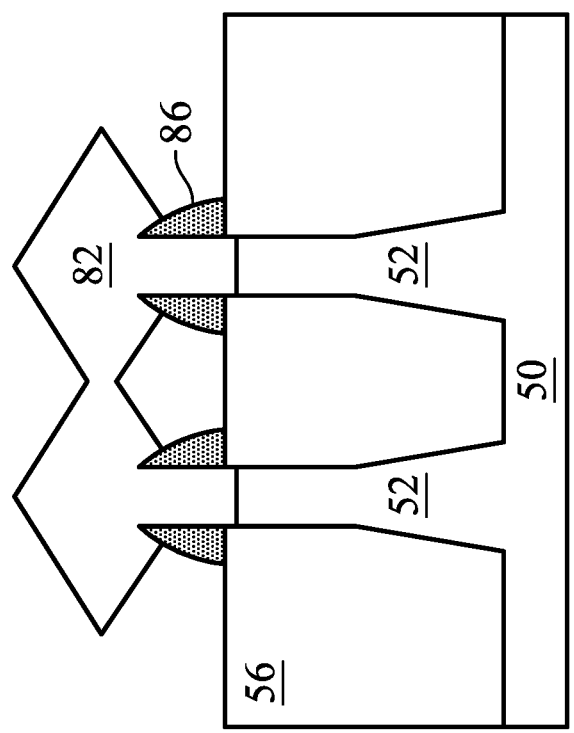

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ atoms/cm$^3$ and about $10^{21}$ atoms/cm$^3$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
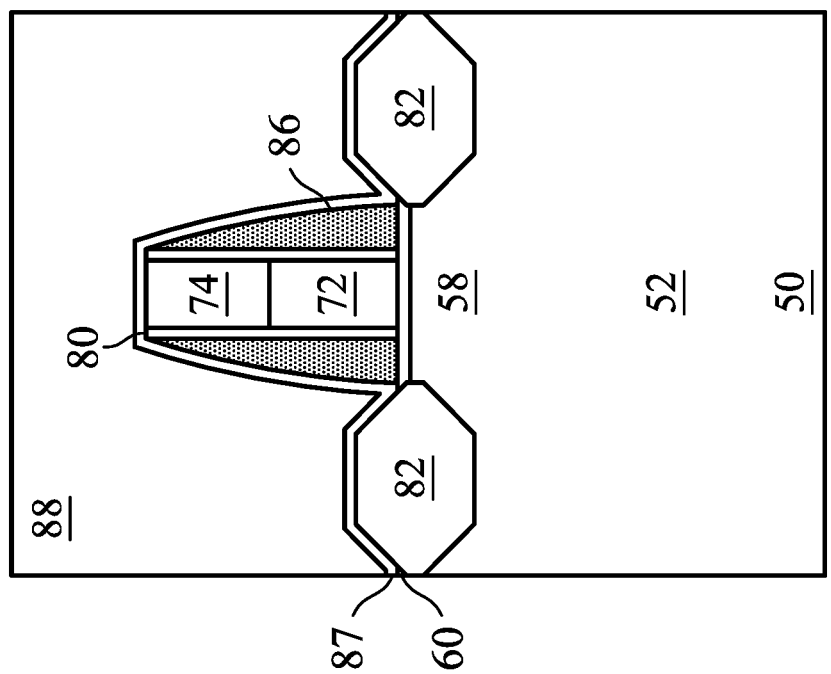
Figure 11A:
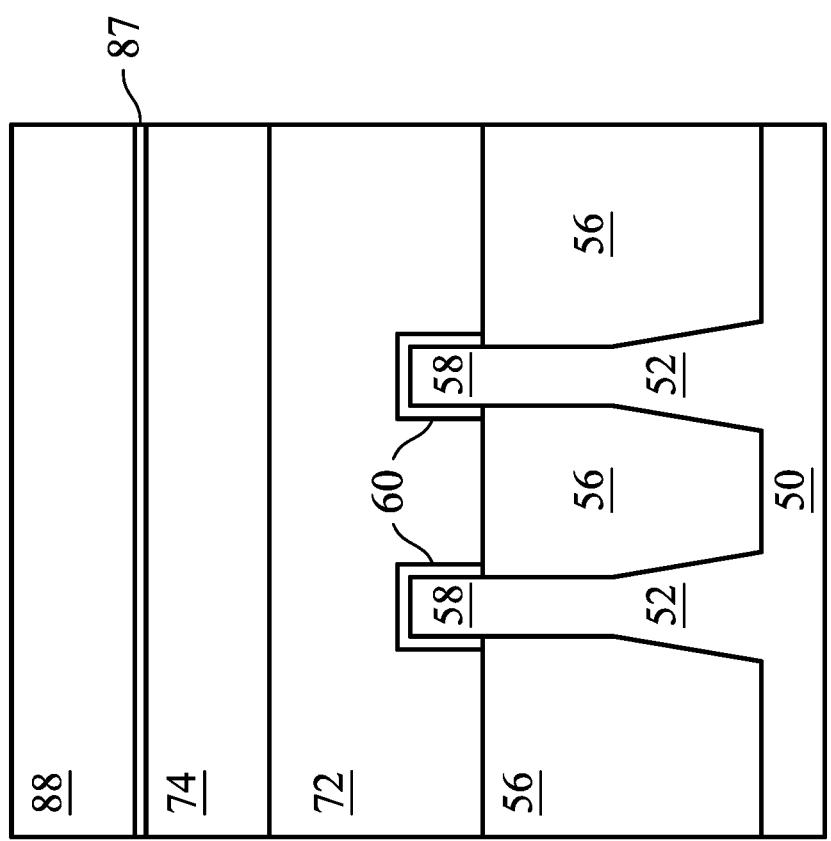

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, the gate spacers 86, and the gate seal spacers 80. The CESL 87 may comprise a dielectric material, such as, silicon nitride, silicon oxide, silicon oxynitride, or the like, having a different etch rate than the material of the overlying first ILD 88.

Figure 12B:
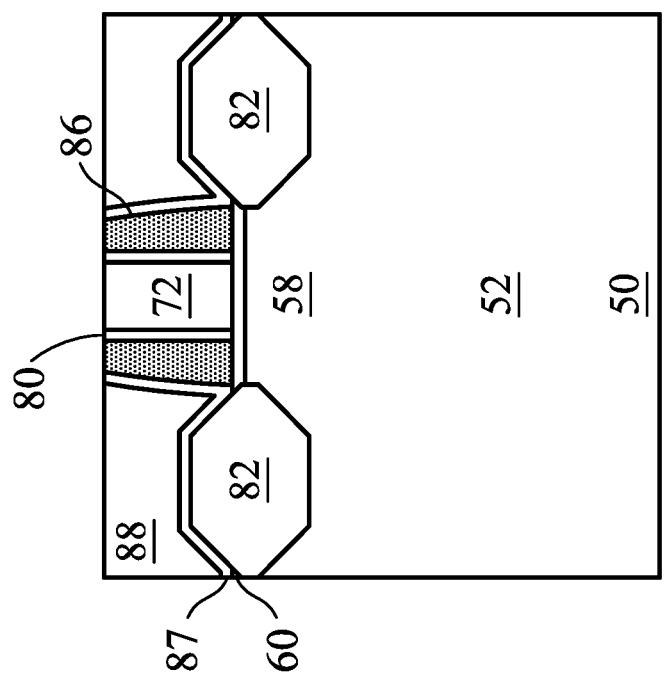
Figure 12A:
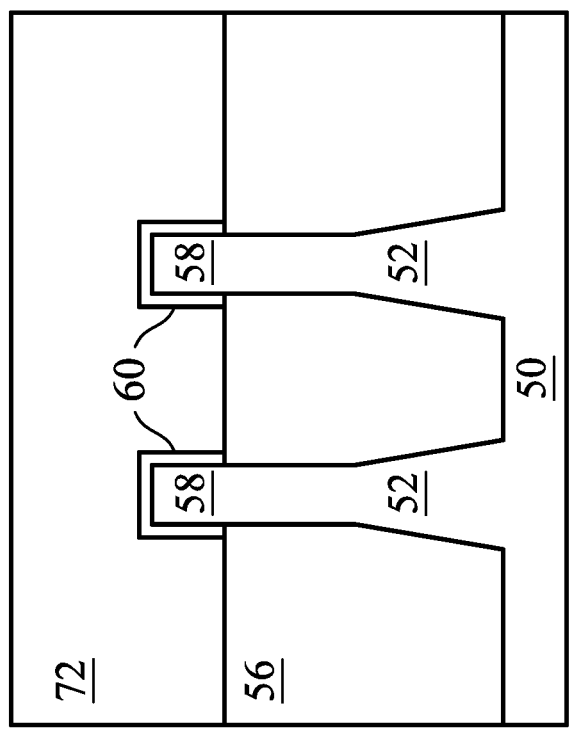

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

In FIGS. 13A and 13B, the dummy gates 72, and the masks 74, if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

FIGS. 14, 15, and 17 through 20 illustrate steps for forming dielectric layers and work function layers over the structure of FIGS. 13A and 13B. FIG. 16A illustrates a production tool 200 which may be used to perform a plasma treatment on a work function layer deposited over the substrate 50. FIG. 16B illustrates work function compositions after exposure to plasmas generated with varying gas flow rates. FIGS. 14, 15, 17, 18, 19A, and 20 illustrate features in both the region 50N and the region 50P, and FIGS. 19B and 19C illustrate features in the region 50P. FIGS. 14, 15, 17, 18, 19A, and 20 are illustrated along reference cross-section A-A illustrated in FIG. 1, except for multiple fins/FinFETs, and FIGS. 19B and 19C are illustrated along reference cross-section B-B illustrated in FIG. 1, except for multiple fins/FinFETs.

Figure 14:
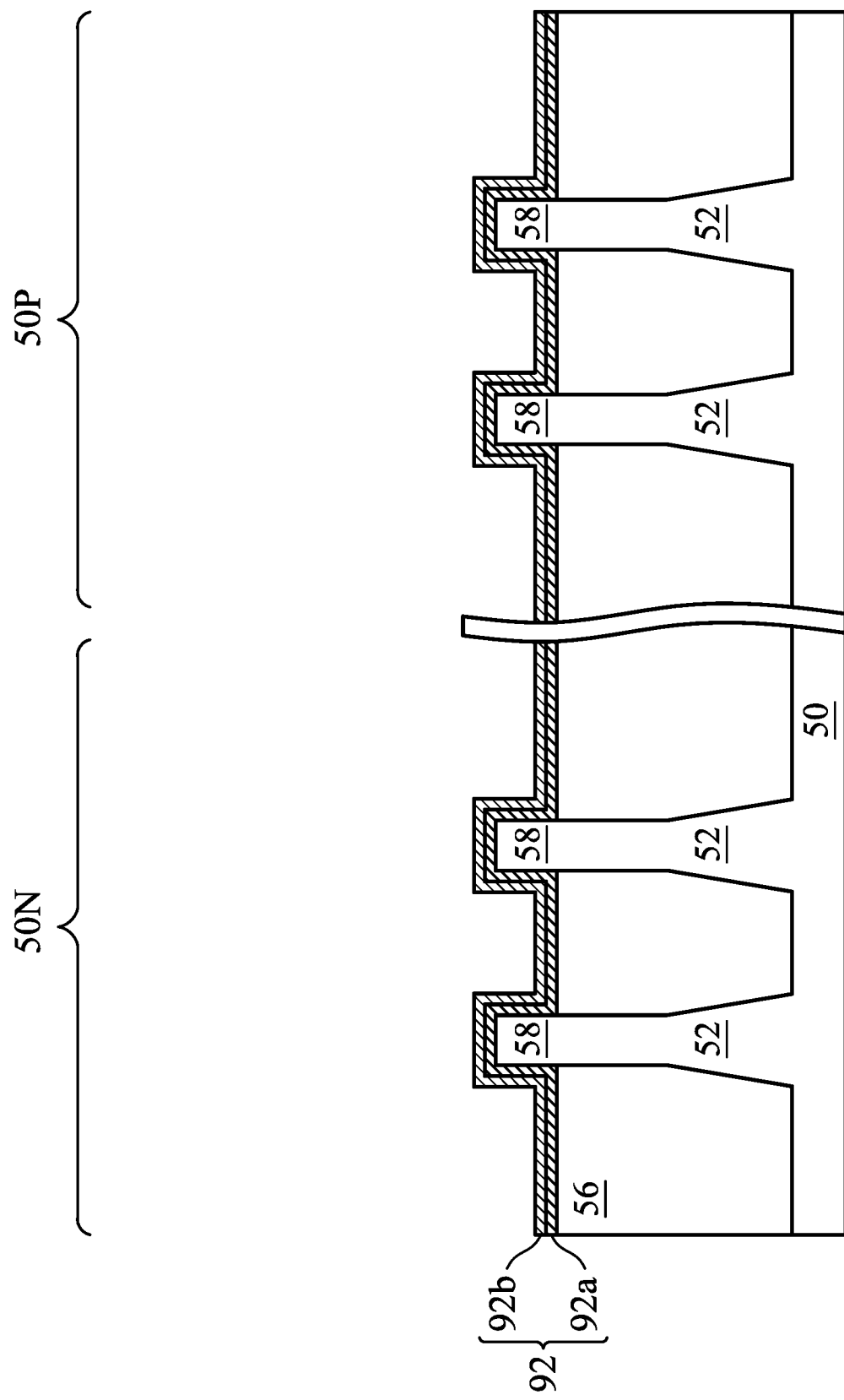

In FIG. 14, a gate dielectric layer 92 is deposited over the structures of FIGS. 13A and 13B. The gate dielectric layer 92 may include an interfacial layer 92a and a high-k dielectric layer 92b deposited over the interfacial layer 92a. The interfacial layer 92a may be an oxide layer (such as a silicon oxide layer), multiple layers thereof, or the like, which may be formed through thermal oxidation of the fins 52, a chemical oxidation process, or a deposition process. The interfacial layer 92a may be conformally deposited on top surfaces and sidewalls of the fins 52 and on top surfaces of the STI regions 56. The high-k dielectric layer 92b may be formed of a high-k dielectric material such as hafnium oxide, lanthanum oxide, aluminum oxide, zirconium oxide, multiple layers thereof, or the like. The high-k dielectric layer 92b may have a dielectric constant (k-value) of about 3.9 or greater, about 7.0 or greater, or about 21.0 or greater. The high-k dielectric layer 92b may be conformally deposited over top surfaces and sidewalls of the interfacial layer 92a. In accordance with some embodiments of the present disclosure, the high-k dielectric layer 92b may be formed using ALD, CVD, or the like.

The gate dielectric layers 92 in the region 50N and the region 50P may be formed simultaneously such that the gate dielectric layers 92 in each region are formed from the same materials. In some embodiments, the gate dielectric layers 92 in the region 50N and the region 50P may be formed by distinct processes, such that the gate dielectric layers 92 may be different materials. Various masking steps may be used to mask and expose appropriate regions when using distinct processes.

In some embodiments, a barrier layer (not separately illustrated) is optionally formed over the gate dielectric layer 92. The barrier layer may be formed between the gate dielectric layer 92 and a subsequently formed work function layer (e.g., the first work function layer 94 illustrated in FIG. 15). The barrier layer may be a metal layer and may be formed of, for example, TaN or the like. The barrier layer may be formed by a deposition process, such as ALD, CVD, PECVD, PVD, sputter deposition, or the like.

Figure 15:
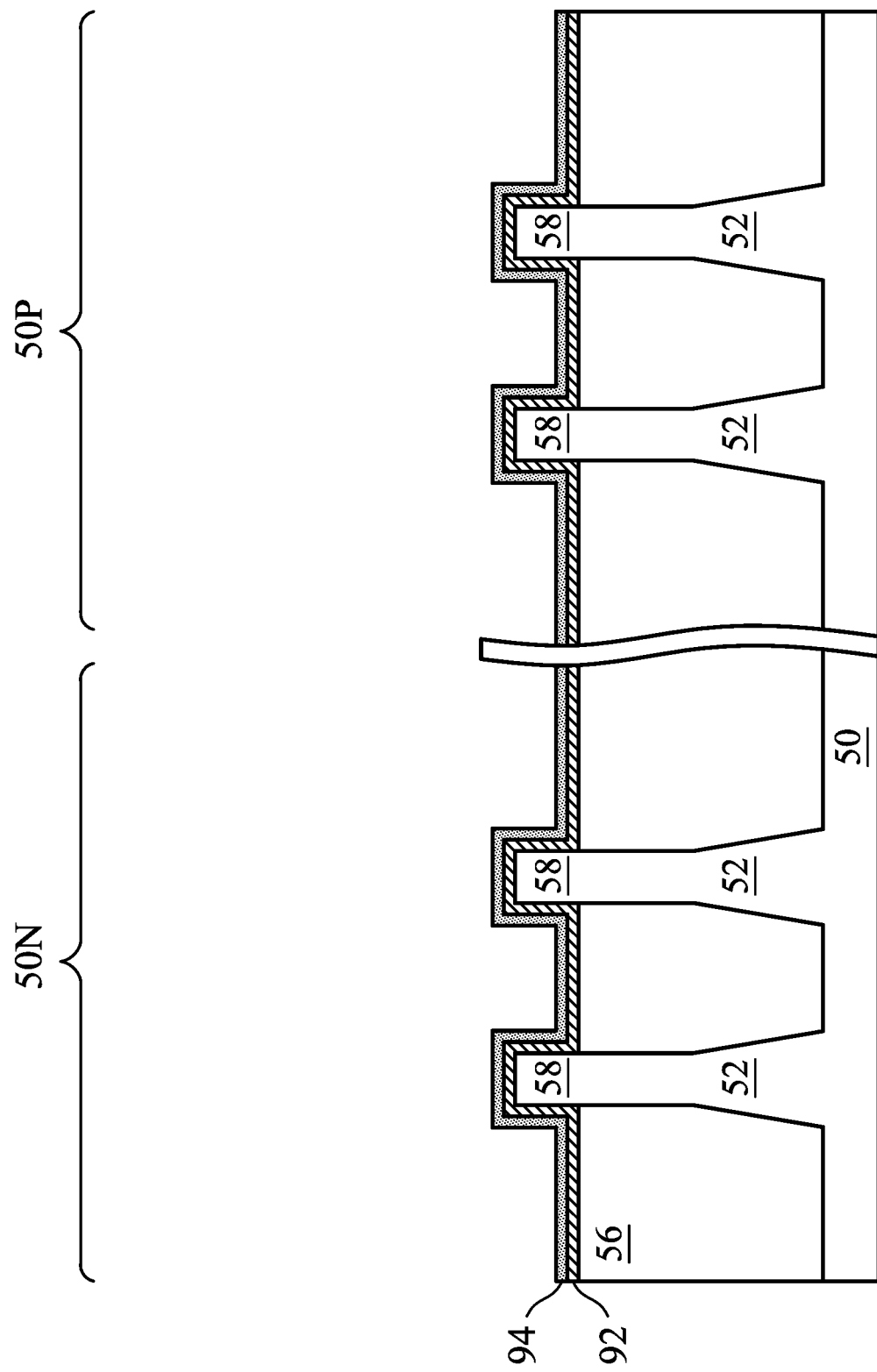
Figure 16A:
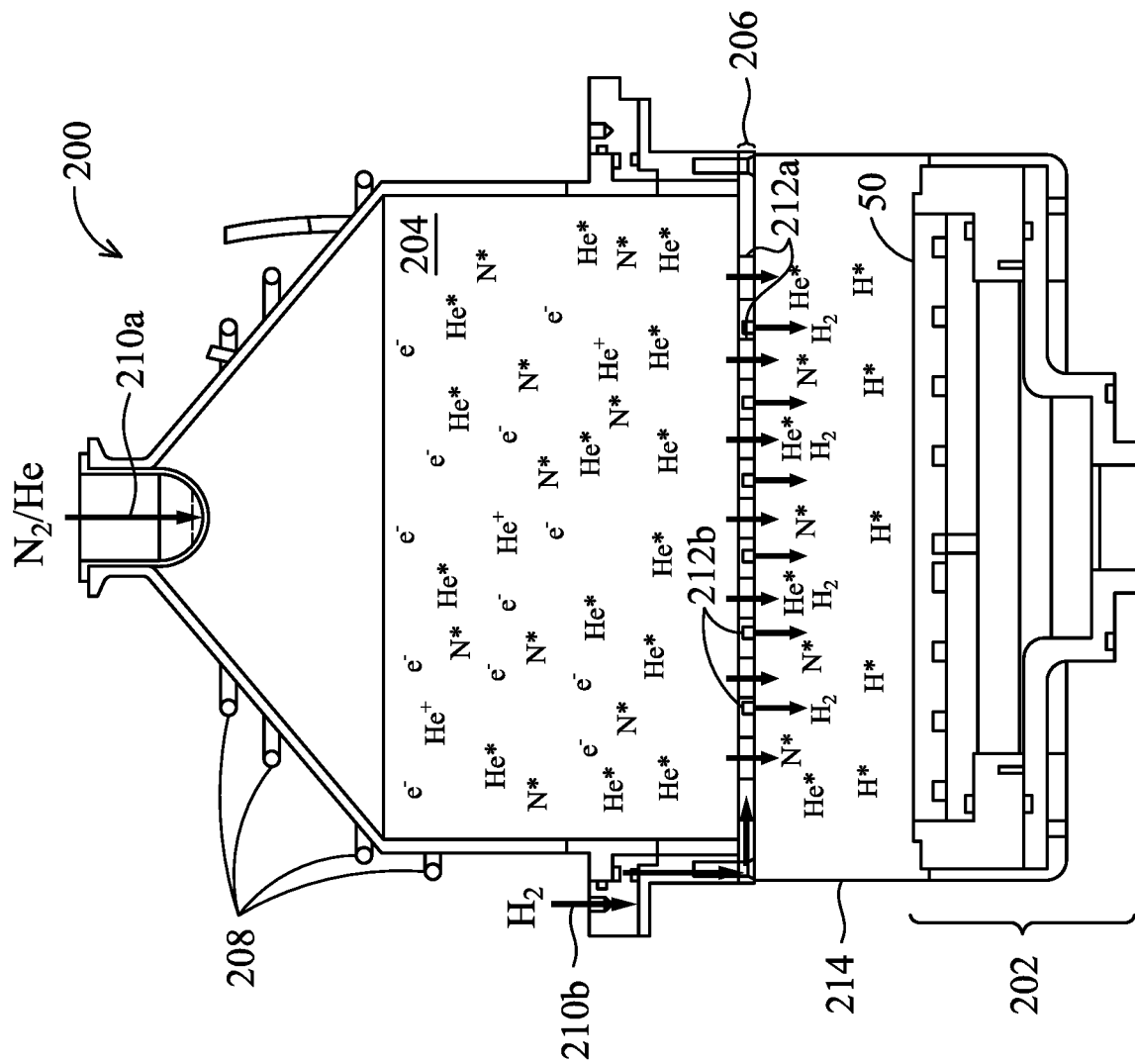
FIG. 16A illustrates a cross-sectional view of a plasma production tool for treating a FinFET, in accordance with some embodiments.
Figure 16B:
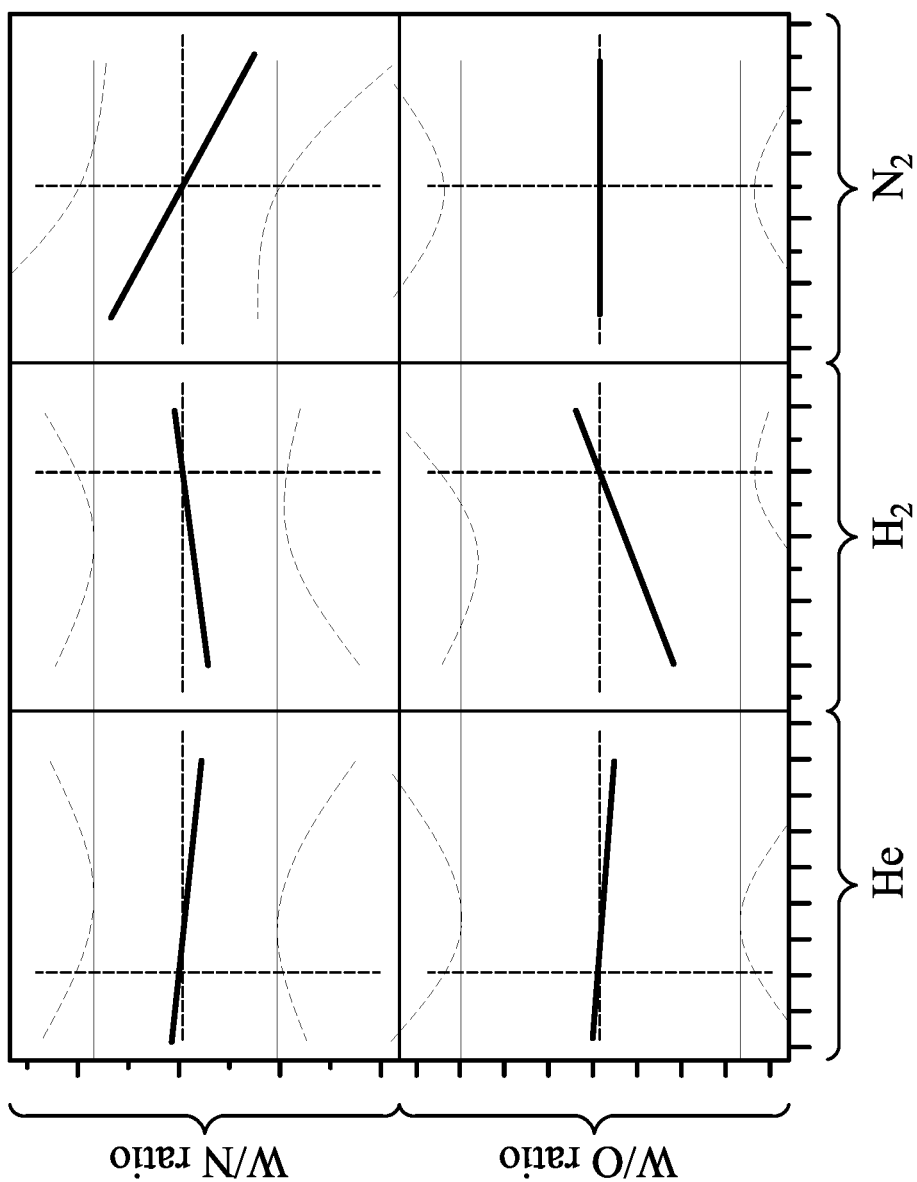
FIG. 16B illustrates a graph of work function composition after exposure to plasmas generated with varying gas flow rates, in accordance with some embodiments.

In FIG. 15, a first work function layer 94 is deposited over the gate dielectric layer 92. The interfacial layer 92a and the high-k dielectric layer 92b have been illustrated as a single gate dielectric layer 92 for ease of illustration. The first work function layer 94 may be formed by a deposition process, such as ALD, CVD, PECVD, PVD, sputter deposition, or the like. In various embodiments, the first work function layer 94 may include p-type work function metals. Examples of materials that may be used for the first work function layer 94 include WCN, TiN, TaN, Ru, Mo, Al, WN, $ZrSi_2$, $MoSi_2$, $TaSi_2$, $NiSi_2$, WN, other suitable p-type work function materials, or combinations thereof. In a specific embodiment, the first work function layer 94 may comprise tungsten carbon nitride (WCN). In further embodiments, the first work function layer 94 may comprise any tungsten-based material, such as tungsten nitride or the like. The first work function layer 94 may comprise a single layer or multiple layers.

The first work function layer 94 may be deposited to a thickness from about 0.8 nm to about 1.5 nm, such as about 1.3 nm. The first work function layer 94 may be deposited with a density from about 8.0 g/cm$^3$ to about 12.0 g/cm$^3$, such as about 9.4 g/cm$^3$. In embodiments in which the first work function layer 94 comprises WCN, an atomic concentration of carbon in the first work function layer 94 may be from about 1.0% to about 3.0%, such as about 1.5%; an atomic concentration of tungsten may be from about 10.0% to about 30.0%, such as about 16.4%; an atomic concentration of nitrogen may be from about 5.0% to about 15.0%, such as about 9.2%; and a ratio of tungsten atoms to nitrogen atoms may be from about 1.10 to about 1.90 such as about 1.71. The first work function layer 94 may have a $\beta$-$W_2N$ orientation.

FIG. 16A illustrates the production tool 200 for generating the plasma used in the plasma treatment performed on the first work function layer 94 once the first work function layer 94 has been deposited. The production tool 200 includes a wafer holder 202 on which the substrate 50 may be placed. The wafer holder 202 may be, e.g., an electrostatic chuck, which provides electrostatic charges to clamp the substrate 50 to the wafer holder 202 without mechanical fasteners. The production tool 200 further includes a first plasma generation chamber 204 and a showerhead 206 disposed over the wafer holder 202, and a second plasma generation chamber 214 disposed between the showerhead 206 and the wafer holder 202. A first plasma may be generated in the first plasma generation chamber 204 using a plasma generator such as a transformer-coupled plasma (TCP) system, an inductively coupled plasma (ICP) system, a magnetically-enhanced reactive ion etching system, an electron cyclotron resonance system, a remote plasma generator, or the like. In some embodiments, a coil 208 may be included in the first plasma generation chamber 204 and may be used to generate the first plasma in the first plasma generation chamber 204. The first plasma may be used to generate a second plasma in the second plasma generation chamber 214.

An excitation gas is supplied to the production tool 200 through a first inlet 210a disposed at a top of the first plasma generation chamber 204. The excitation gas may include a reaction species and a generation species.

The reaction species may be a species which is capable of generating a first metastable species with a long life. For example, the first metastable species generated from the reaction species may have a lifetime of greater than about 2 seconds. As such, the first metastable species may be generated in the first plasma generation chamber 204 and may have a lifetime long enough to pass through the showerhead 206 and strike the substrate 50. The reaction species may further be a species which will react with the first work function layer 94. In some embodiments, the reaction species may comprise nitrogen ($N_2$), helium (He), hydrogen ($H_2$), combinations thereof, or the like.

The generation species may be a species which is capable of generating a second metastable species which may be used to generate the second plasma between the showerhead 206 and the substrate 50. The second plasma may be generated by transferring energy from the second metastable species to a reaction gas supplied between the showerhead 206 and the substrate 50. In some embodiments, the generation species may comprise helium (He), argon (Ar), oxygen ($O_2$), combinations thereof, or the like.

The first plasma may be generated in the first plasma generation chamber 204 using a plasma generation process at a temperature from about 100° C. to about 300° C., such as about 200° C. The plasma generation process may be performed at a pressure from about 1.0 Torr to about 2.0 Torr, such as about 1.5 Torr using an RF power from about 1,000 W to about 3,000 W, such as about 2,000 W, supplied to the coil 208. In some embodiments, the excitation gas may include the reaction species (e.g., nitrogen) which may be supplied at a flowrate from about 1,000 sccm to about 9,000 sccm, such as about 5,000 sccm and the generation species (e.g., helium) which may be supplied at a flowrate from about 1,000 sccm to about 4,500 sccm, such as about 2,750 sccm. Generating the first plasma using the above-described process conditions generates metastable species in the first plasma which have sufficient energy to generate the second plasma, without having sufficient energy to cause excessive erosion or damage to the first plasma generation chamber 204, the showerhead 206, the second plasma generation chamber 214, or the substrate 50.

The showerhead 206 may be a dual-plenum meta-stable activated radical strip (MARS), which separates charged species in the first plasma from metastable species in the first plasma. For example, the first plasma may include metastable nitrogen $N^*$, nitrogen ions $N^+$, metastable helium $He^*$, helium ions $He^+$, and electrons $e^-$. The showerhead 206 may be grounded and may be used to remove the charged species (e.g., nitrogen ions $N^+$, helium ions $He^+$, and electrons $e^-$) from the first plasma, delivering the metastable species (e.g., metastable nitrogen $N^*$ and metastable helium $He^*$) to the second plasma generation chamber 214 without the charged species. As illustrated in FIG. 16A, the metastable species pass from the first plasma generation chamber 204 to the second plasma generation chamber 214 through first openings 212a in the showerhead 206.

The reaction gas may be supplied to the second plasma generation chamber 214 through a second inlet 210b disposed on a side of the first plasma generation chamber 204. The reaction gas may be used to both lower the energy of the metastable species (e.g., metastable nitrogen $N^*$ and metastable helium $He^*$) supplied to the second plasma generation chamber 214 and also to react with the first work function layer 94. The reaction gas may be hydrogen ($H_2$); however, other gases such as oxygen ($O_2$) or the like may be used. As illustrated in FIG. 16A, the reaction gas passes through second openings 212b in the showerhead 206, which are separated from the first openings 212a.

The metastable species from the first plasma and the reaction gas then interact with each other between the showerhead 206 and the substrate 50. Energy is transferred from the metastable species (e.g., the metastable nitrogen $N^*$ and the metastable helium $He^*$) to the reaction gas (e.g., hydrogen), which generates the second plasma directed towards the substrate 50. In embodiments in which the reaction gas comprises hydrogen, the energy transferred from the metastable species to the reaction gas coverts the hydrogen to metastable hydrogen $H^*$. After the metastable species and the reaction gas react to form the second plasma, the second plasma may include metastable nitrogen $N^*$, metastable helium He, and metastable hydrogen $H^*$. Because energy is transferred from the metastable species to the reaction gas to generate the second plasma, the energy of the second plasma is less than that of the metastable species, which reduces damage to the first work function layer 94. Moreover, generating the second plasma in the second plasma generation chamber 214 reduces erosion of chamber surface materials, which could be caused by generating the second plasma earlier in the process. In various embodiments, the reaction gas (e.g., hydrogen) may be supplied at a flowrate from about 1,000 sccm to about 9,000 sccm, such as about 5,000 sccm.

The substrate 50 may be exposed to the second plasma for a period sufficient for the first work function layer 94 to become saturated with nitrogen (e.g., a ratio of tungsten to nitrogen is less than about 1.2). For example, the substrate 50 may be exposed to the second plasma for a period from about 0 seconds to about 300 seconds, such as about 90 seconds. When the first work function layer 94 is exposed to the metastable nitrogen, a chemical reaction may occur in which the metastable nitrogen is attached to dangling bonds in the first work function layer 94 (e.g., tungsten). The reaction of the metastable nitrogen with the material of the first work function layer 94 causes the first work function layer 94 to recrystallize, increasing the (111) crystal planes in the first work function layer 94 and increasing the density of the first work function layer 94.

In a particular embodiment in which the first work function layer comprises tungsten and the reaction species comprises nitrogen, the first work function layer 94 may have a β-$W_2N$ orientation following the plasma treatment process. Additionally, the first work function layer 94 may have a density from about 9.4 g/cm$^3$ to about 12.0 g/cm$^3$, such as about 10.8 g/cm$^3$ after the plasma treatment.

When the first work function layer 94 is exposed to the metastable hydrogen, the metastable hydrogen may react with carbon included in the first work function layer 94 to form volatile byproducts (e.g., hydrocarbons) which may be removed from the second plasma generation chamber 214. This lowers the concentration of carbon in the first work function layer 94. Additionally, a portion of the metastable helium may be implanted into the first work function layer 94, with a remainder of the metastable helium returning to ground state and being removed from the second plasma generation chamber 214. The second plasma generation chamber 214 may further include an exhaust outlet (not separately shown), which may be used to evacuate exhaust materials or reaction byproducts (e.g., the volatile carbon byproducts, ground state helium, and the like). The exhaust outlet may be connected to a vacuum pump in order to help evacuate the exhaust materials.

By increasing the nitrogen concentration, removing carbon, and recrystallizing the first work function layer 94, the overall composition of the first work function layer 94 will be modified. For example, performing the plasma treatment on the first work function layer 94 may decrease a ratio of tungsten atoms to nitrogen atoms to from about 1.20 to about 1.71, less than about 1.20, or about 1.17. The atomic concentration of tungsten may be from about 10.0% to about 30.0%, such as about 16.5%; the atomic concentration of nitrogen may be increased to from about 9.2% to about 15.0%, such as about 14.1%; and the atomic concentration of carbon may be decreased to from about 0% to about 0.1%, or less than about 0.1%.

The increased nitrogen concentration in the first work function layer 94 coupled with the increased density, decreased grain size, and altered crystal type may improve adhesion of a subsequently deposited bottom anti-reflective coating (BARC) layer (such as BARC layer 96, discussed below in reference to FIG. 17) to the first work function layer 94. Specifically, a contact angle between the BARC layer 96 and the plasma treated first work function layer 94 may be from about 0 degrees to about 80 degrees, such as about 63 degrees, as opposed to about 0 degrees in an untreated work function layer. This limits any peeling of the BARC layer 96, and improves the accuracy of patterning of the first work function layer 94.

Moreover, decreasing the carbon concentration in the first work function layer 94 may provide greater control over the composition of the first work function layer 94, as the carbon concentration in the first work function layer 94 may be difficult to control. This improves device performance and reduces device defects.

FIG. 16B is a graph illustrating the variation of ratios of tungsten to nitrogen and tungsten to oxygen in the first work function layer 94 in response to varying flowrates of helium (supplied, e.g., in the generation species), hydrogen (supplied, e.g., in the reaction gas), and nitrogen (supplied, e.g., in the reaction species) supplied to the first plasma generation chamber 204 and the second plasma generation chamber 214. The y-axis of FIG. 16B illustrates tungsten to nitrogen (W/N) ratios ranging from 0.65 to 0.8 and tungsten to oxygen (W/O) ratios ranging from 0.225 to 0.265, while the x-axis illustrates helium (He) flowrates ranging from 0 sccm to 4,500 sccm, hydrogen ($H_2$) flowrates ranging from 1,000 sccm to 5,000 sccm, and nitrogen ($N_2$) flowrates ranging from 0 sccm to 10,000 sccm. As illustrated in FIG. 16B, increasing the flowrate of helium decreases the ratio of tungsten to nitrogen and the ratio of tungsten to oxygen. Increasing the flowrate of hydrogen increases the ratio of tungsten to nitrogen and the ratio of tungsten to oxygen. Increasing the flowrate of nitrogen degreases the ratio of tungsten to nitrogen and has little to no impact on the ratio of tungsten to oxygen. The flowrates of helium, hydrogen, and nitrogen may be altered in order to achieve desired ratios of tungsten to nitrogen and tungsten to oxygen in the first work function layer 94. In various embodiments, a tungsten to nitrogen ratio of about 0.75 and a tungsten to oxygen ratio of about 0.24 may be achieved by supplying helium to the first plasma generation chamber 204 at a flowrate of about 1,000 sccm, supplying nitrogen to the first plasma generation chamber 204 at a flowrate of about 5,000 sccm, and supplying hydrogen to the second plasma generation chamber 214 at a flowrate of about 4,000 sccm.

Figure 17:
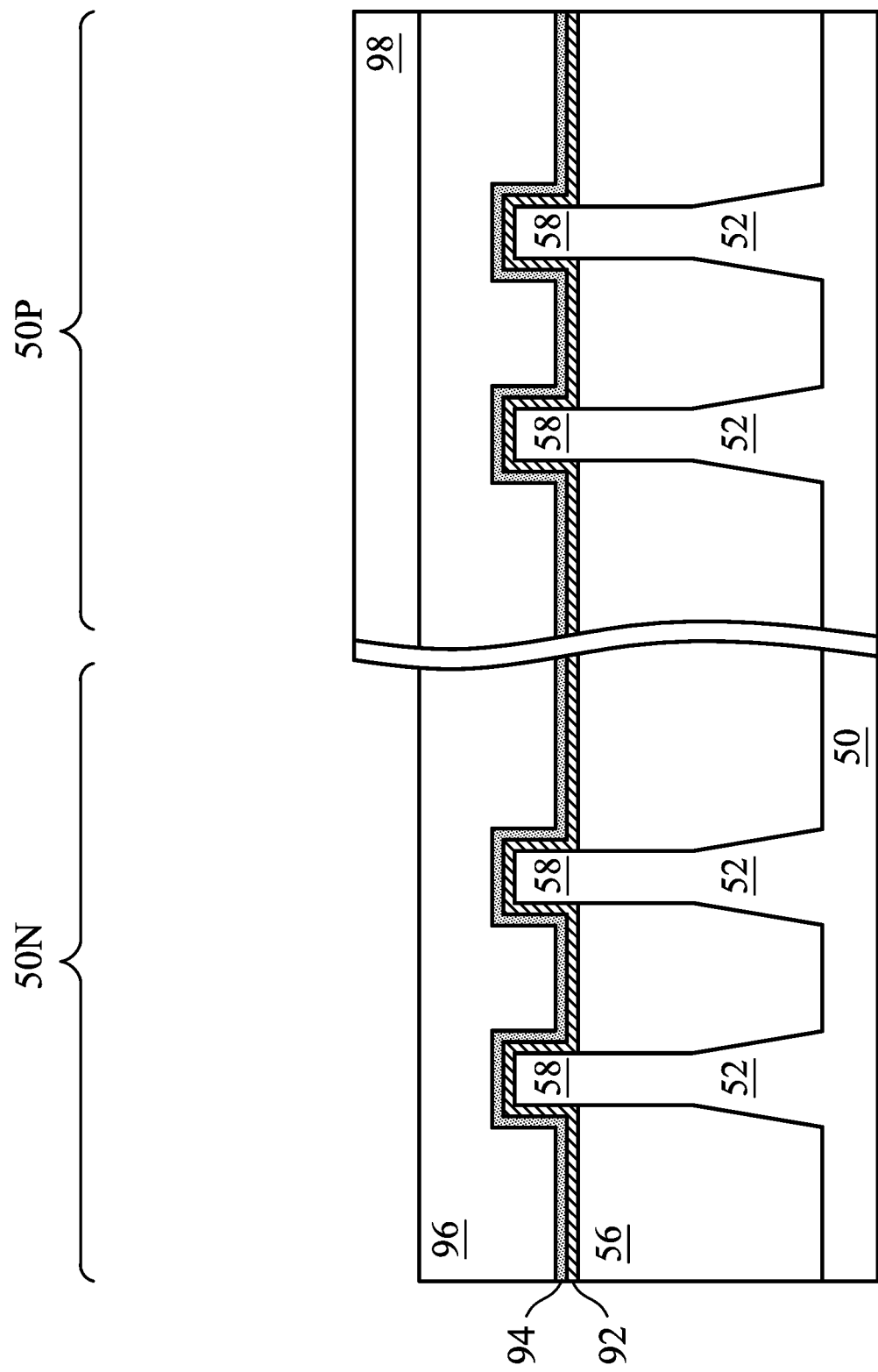
FIGS. 17, 18, 19A, 19B, 19C, 20, 21A, 21B, 21C, 22A, 22B, 23A, and 23B are cross-sectional views of intermediate stages in the manufacturing of FinFETs, in accordance with some embodiments.

In FIG. 17, a bottom anti-reflective coating (BARC) layer 96 and a photoresist layer 98 are deposited over the first work function layer 94. The BARC layer 96 may be deposited directly on the first work function layer 94 using spin-on coating or the like. Performing the plasma treatment on the first work function layer 94 may increase a contact angle between the BARC layer 96 and the first work function layer 94 to from about 0° to about 80°, such as about 63°. The plasma treatment increases the adhesion between the BARC layer 96 and the first work function layer 94 such that an additional intervening layer (such as a hexamethyldisilazane (HMDS) layer) is not required, which reduces cost and processing time. As illustrated in FIG. 17, a topmost surface of the BARC layer 96 may be level. The photoresist layer 98 is then formed over the BARC layer 96. The photoresist layer 98 may be deposited using spin-on coating or the like. Further in FIG. 17, the photoresist layer 98 is patterned to expose the BARC layer 96 in the region 50N. The photoresist layer 98 may be patterned by exposing the photoresist layer 98 to a patterned energy source and developing the photoresist layer 98 to remove an exposed or unexposed portion of the photoresist layer 98.

Figure 18:
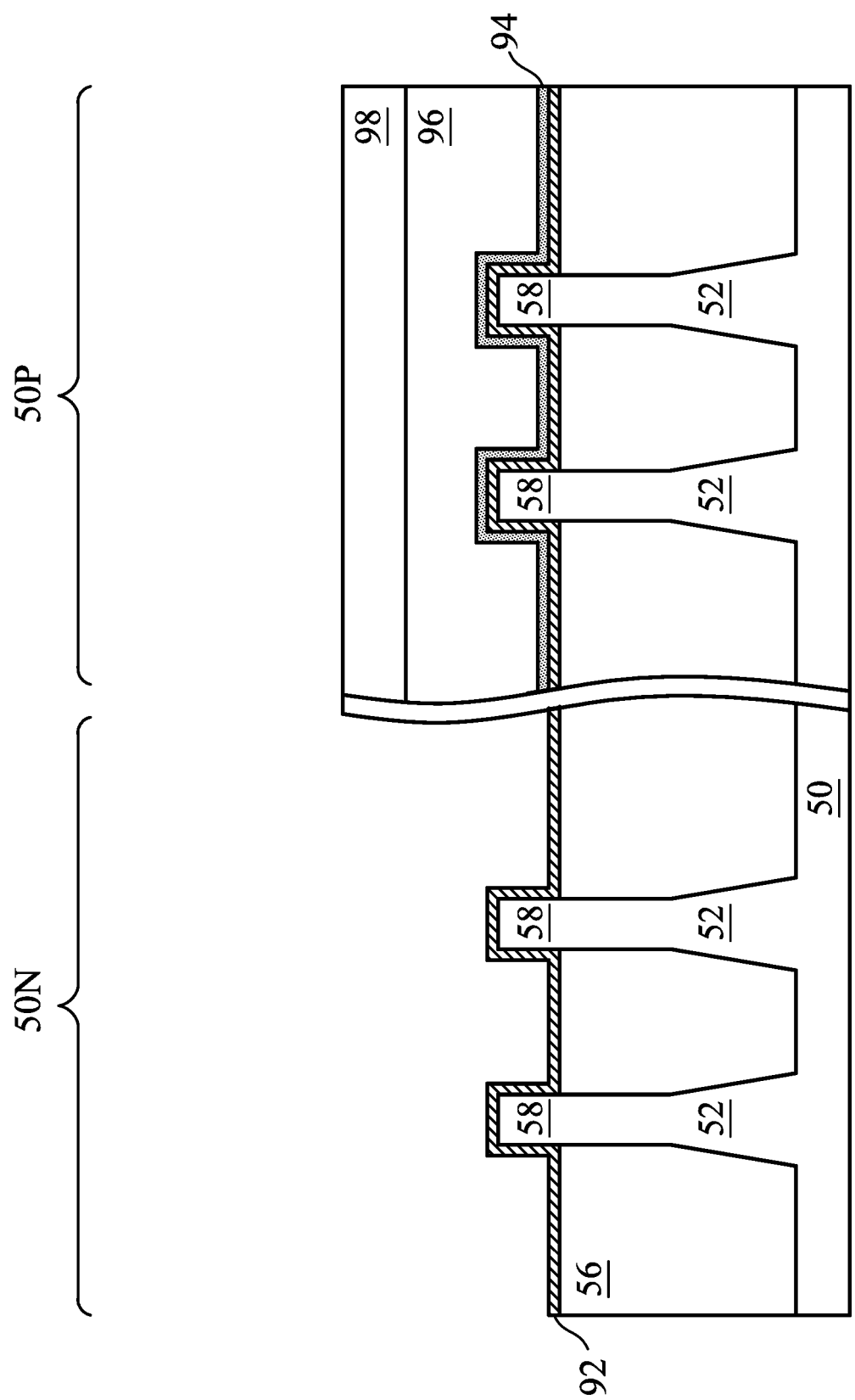

In FIG. 18, the BARC layer 96 and the first work function layer 94 are etched using the photoresist layer 98 as a mask. In an embodiment, the BARC layer 96 may be etched using a first etching process, which may be an anisotropic etching process such as a reactive ion etching (RIE) process. However, any suitable process, such as a wet etching process, and any suitable reactants may be used. The first work function layer 94 may be etched using a wet etching process, which may include etchants such as dilute ozonated deionized water (03-DI), a peroxide-based solution ($H_2O_2$), or the like. As illustrated in FIG. 18, the first work function layer 94 may be etched to expose the gate dielectric layer 92 in the region 50N while the region 50P is masked by the photoresist layer 98 and the BARC layer 96.

Figure 19A:
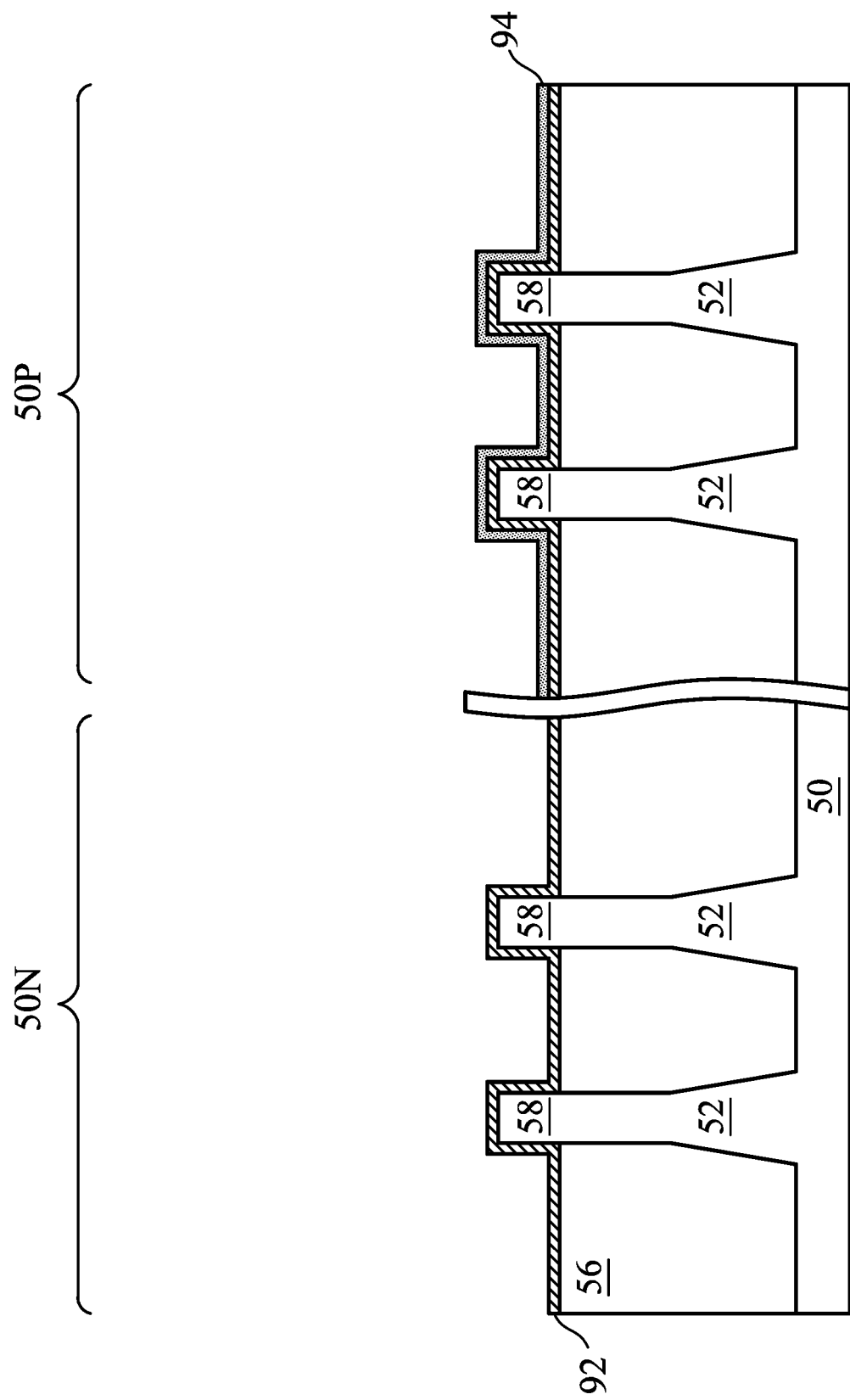
Figure 19C:
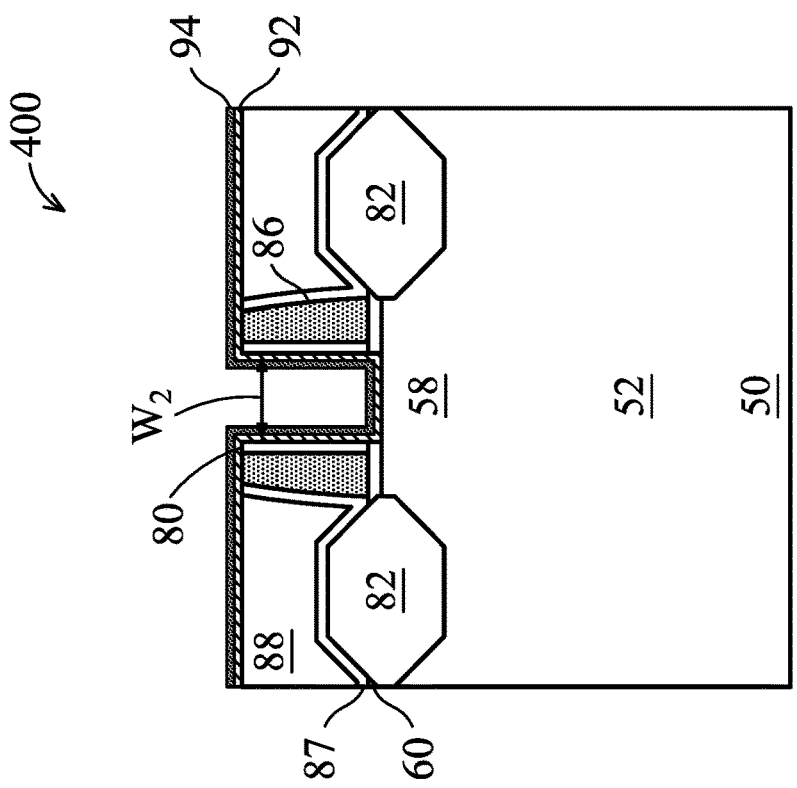
Figure 19B:
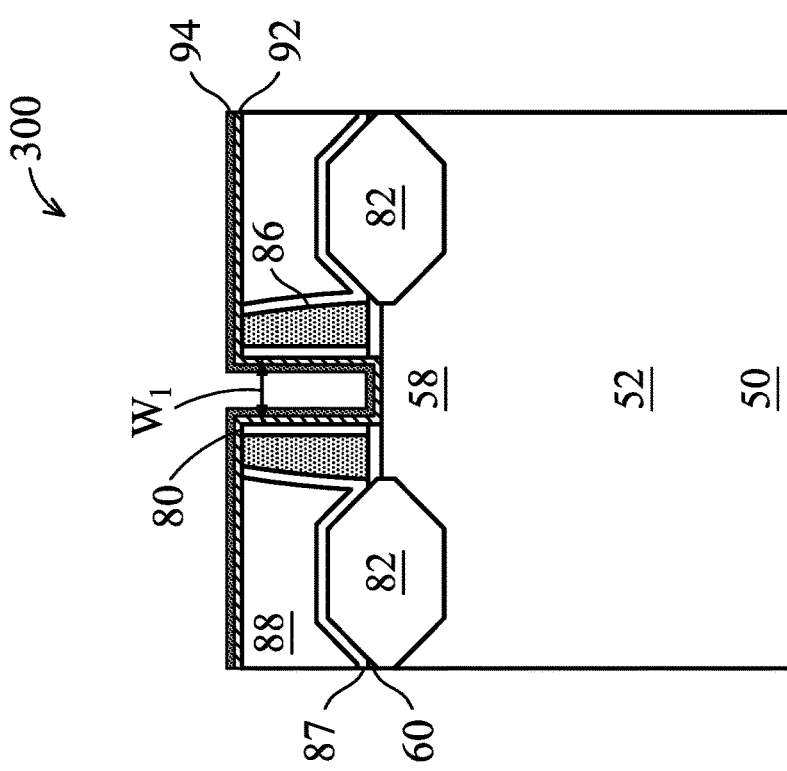

In FIGS. 19A-19C, the photoresist layer 98 and the BARC layer 96 are removed to expose the first work function layer 94 in the region 50P. The photoresist layer 98 and the BARC layer 96 may be removed by any acceptable process, such as an ashing process, a stripping process, or the like. After the photoresist layer 98 and the BARC layer 96 are removed, a rinsing process may be performed on the substrate 50 to clean any residual debris or reactants. Deionized water (DIW) or the like may be used in the rinsing process.

Performing the plasma treatment process on the first work function layer 94 prior to performing the rinsing process on the substrate 50 may also result in a reduction of defects caused by the rinsing process. For example, increasing the nitrogen concentration of the first work function layer 94 reduces or prevents the first work function layer 94 from reacting with a rinsing solution (e.g., DIW) used in the rinsing process. This reduces material loss from the plasma-treated first work function layer 94 caused by the rinsing process and may result in a material loss from the first work function layer 94 of 34 percent or less. Thus, performing the plasma treatment improves control over the thickness of the first work function layer 94, improves device performance, and reduces device defects.

FIGS. 19B and 19C illustrate cross-sectional views of a region 300 of the region 50P in which short-channel FinFETs are formed and a region 400 of the region 50P in which long-channel FinFETs are formed, respectively. A channel length $W_1$ (also referred to as a gate width) in the region 300 may be from about 3 nm to about 6 nm, such as about 5 nm, while a channel length $W_2$ in the region 400 may be from about 100 nm to about 300 nm, such as about 240 nm. In prior art devices, loading effects between the region 300 and the region 400 may be caused by material of the first work function layer 94 being removed to a greater extent in either the region 300 or the region 400 during the processes used to remove the photoresist layer 98 and the BARC layer 96 and during the rinsing process.

Performing the plasma treatment on the first work function layer 94 reduces material loss from the first work function layer 94 in both the region 300 and the region 400 due to the processes used to remove the photoresist layer 98 and the BARC layer 96 and the rinsing process. This reduces the magnitude of thickness differences in the first work function layer 94 between the region 300 and the region 400, reducing the loading effects. For example, following the removal of the photoresist layer 98 and the BARC layer 96 a thickness of the first work function layer 94 in the region 300 may be from about 0.74 nm to about 0.84 nm, such as about 0.79 nm (with a standard deviation being about 0.05 nm) and a thickness of the first work function layer 94 in the region 400 may be from about 0.66 nm to about 1.02 nm, such as about 0.84 nm (with a standard deviation being about 0.18 nm). A ratio of the thickness of the first work function layer 94 in the region 300 to the thickness of the first work function layer 94 in the region 400 is from about 0.81 to about 1.10, such as about 1.06. Reducing the loading effects between the region 300 and the region 400 improves control over the thickness of the first work function layer 94, improves device performance, and reduces device defects.

Figure 20:
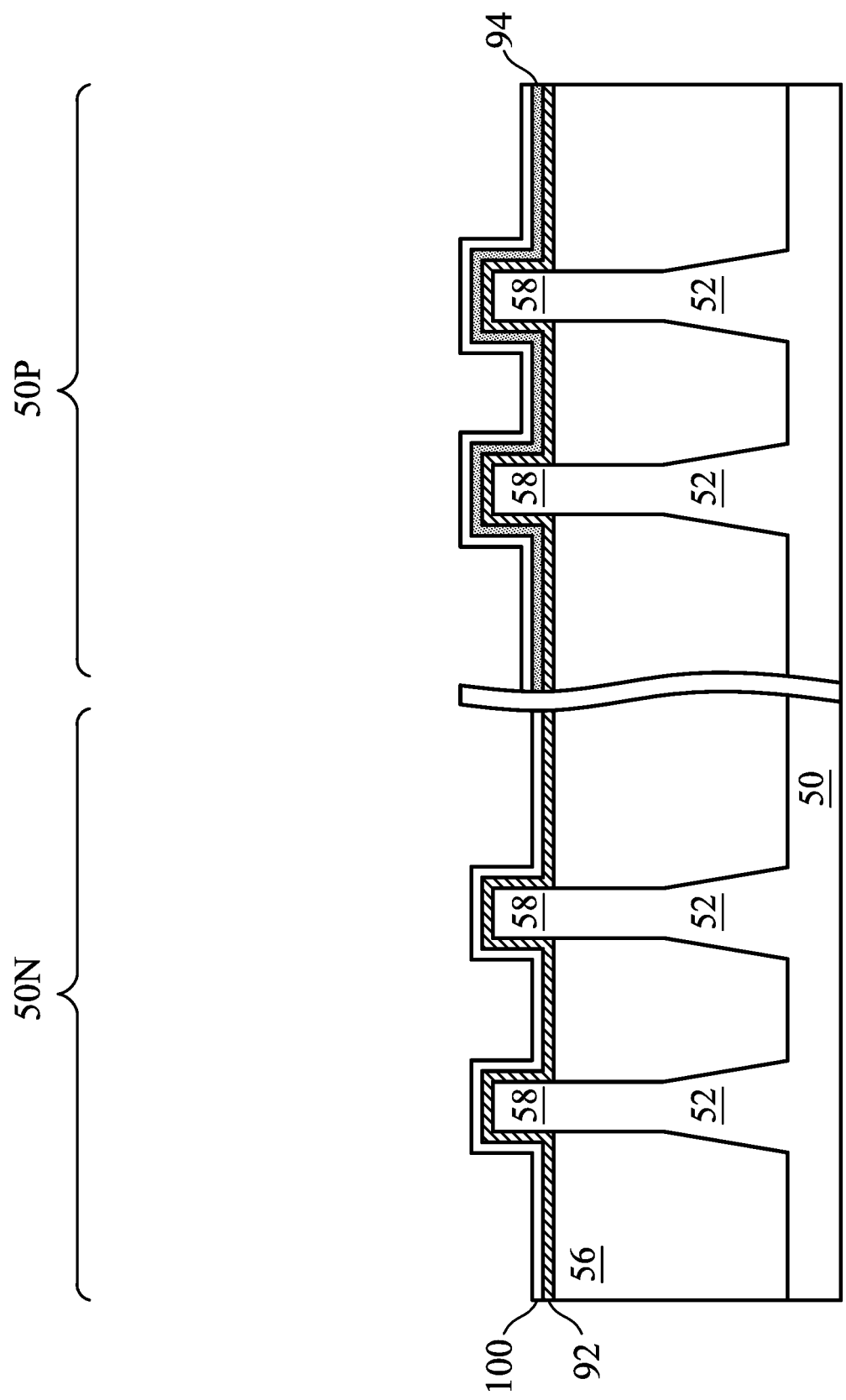

In FIG. 20, a second work function layer 100 is deposited over the gate dielectric layer 92 and the first work function layer 94. The second work function layer 100 may be formed by a deposition process, such as ALD, CVD, PECVD, PVD, sputter deposition, or the like. The second work function layer 100 may comprise an aluminum-based material, a silicon-based material, or a carbon-based material. In various embodiments, the second work function layer 100 may include n-type work function metals. Examples of materials that may be used for the second work function layer 100 include Ti, Ag, TaAl, TaAlC, TiAl, TiAlN, TiAlC, TaC, TaCN, TaSiN, Mn, Zr, AlC, AlCN, AlN, other suitable n-type work function materials, or combinations thereof. The second work function layer 100 may have a thickness from about 10 Å to about 40 Å, such as about 20 Å. The second work function layer 100 may or may not be patterned. In embodiments in which the second work function layer 100 is patterned, the second work function layer 100 may be patterned using processes similar to or the same as the processes used to pattern the first work function layer 94. The deposition and patterning techniques discussed in reference to FIGS. 14-20 may be used to form any number of work function layers in any number of regions with any pattern depending on the desired electrical performance. The structure illustrated in FIG. 20 is merely a specific embodiment illustrating a possible combination of deposited and selectively etched gate dielectric layers and work function layers, and other configurations are also possible. Depositing and patterning work function layers according to the above-described embodiments allows for multi-threshold voltage ($V_{th}$) gate to be formed, which may be used in electronic components, such as transistors. Including a multi-threshold voltage gate allows for speed, delay, and power to be optimized in a semiconductor device.

Figure 21A:
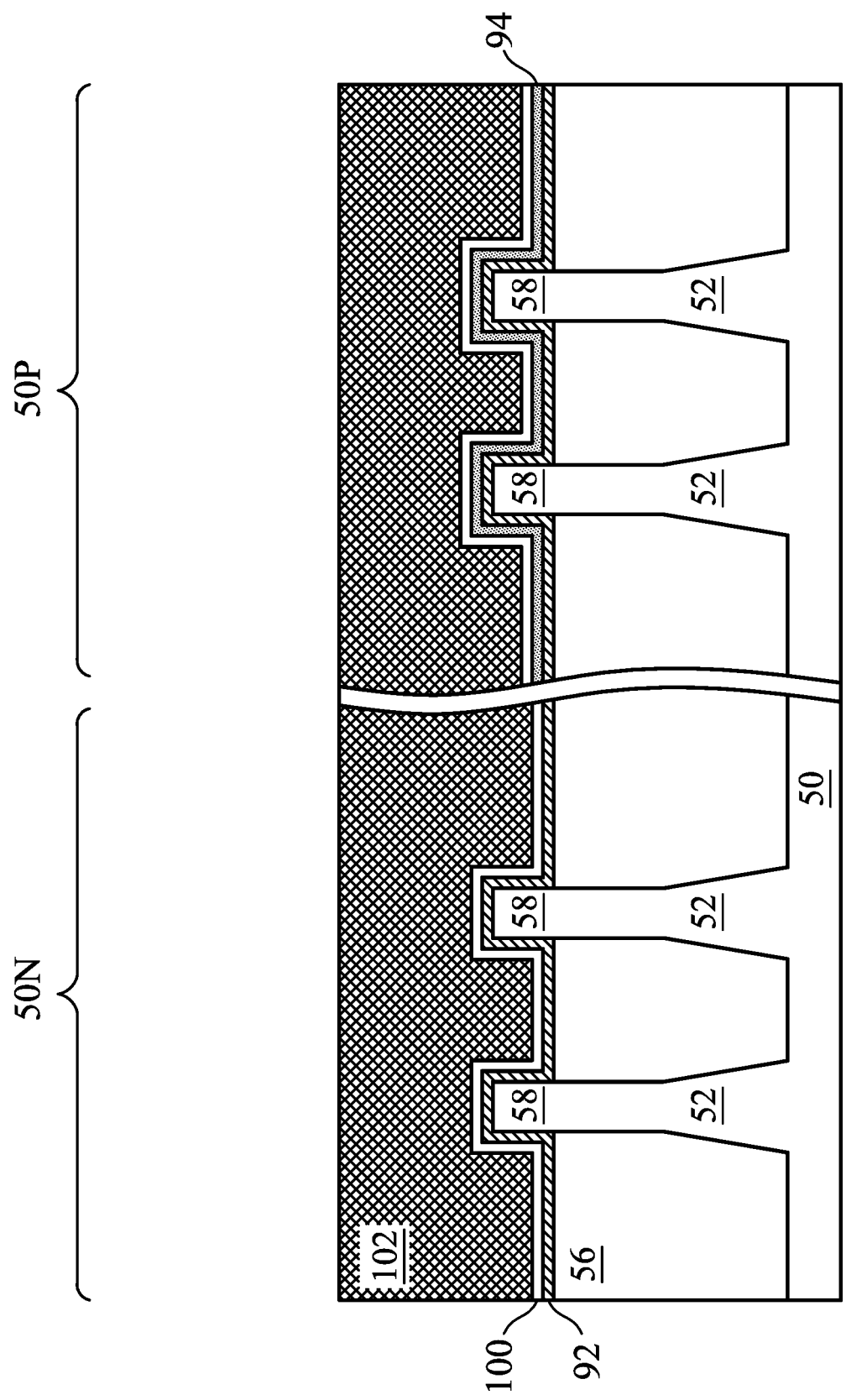
Figure 21C:
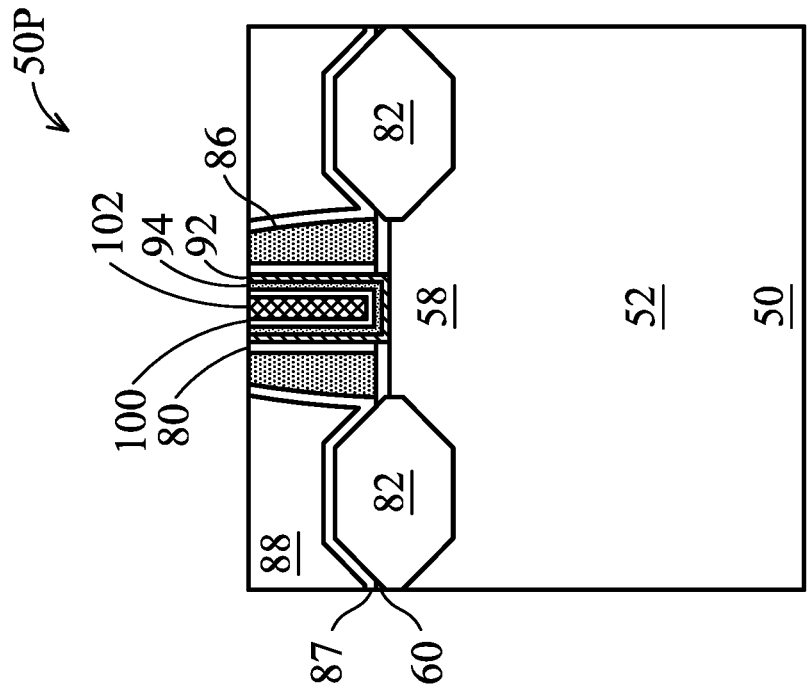
Figure 21B:
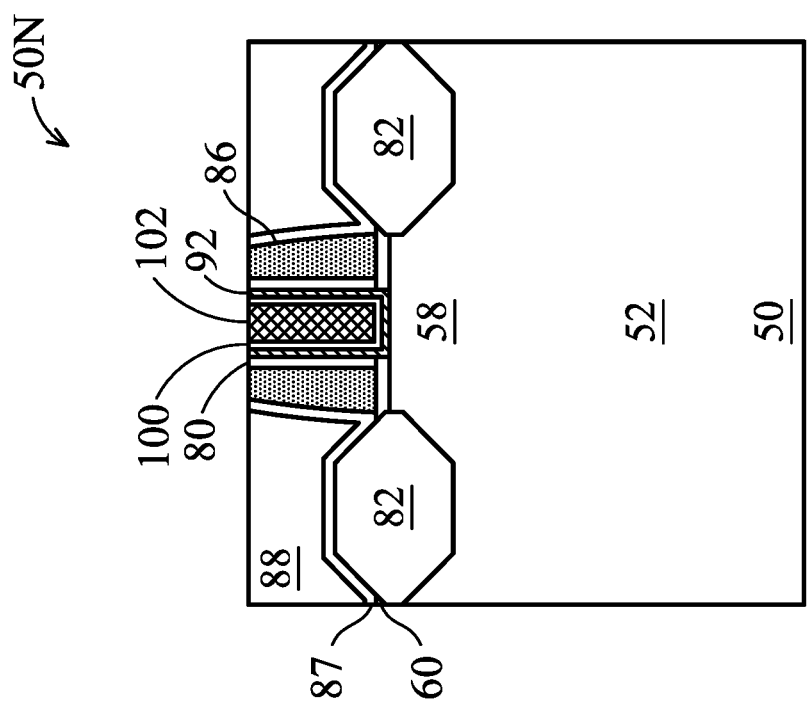

In FIGS. 21A-21C, gate electrodes 102 are formed over the first work function layer 94 and the second work function layer 100 for replacement gates. FIG. 21B illustrates the region 50N and FIG. 21C illustrates the region 50P. The gate electrodes 102 are deposited over the first work function layer 94 and the second work function layer 100 and fill the remaining portions of the recesses 90. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. After the recesses 90 are filled with the material of the gate electrodes 102, a planarization process, such as a CMP, may be performed to remove the excess portions of the gate dielectric layer 92, the first work function layer 94, the second work function layer 100, and the gate electrodes 102, which excess portions are over the top surface of the first ILD 88. The remaining portions of material of the gate electrodes 102, the first work function layer 94, the second work function layer 100, and the gate dielectric layer 92 thus form replacement gates of the resulting FinFETs. The gate electrodes 102, the first work function layer 94, the second work function layer 100, and the gate dielectric layer 92 may be collectively referred to as a "gate stack." The gate and the gate stacks may extend along sidewalls of a channel region 58 of the fins 52.

The gate electrodes 102 in the region 50N and the region 50P may be formed simultaneously such that the gate electrodes 102 in each region are formed from the same materials. In some embodiments, the gate electrodes 102 in the region 50N and the region 50P may be formed by distinct processes, such that the gate electrodes 102 may be different materials. Various masking steps may be used to mask and expose appropriate regions when using distinct processes.

FIGS. 22A through 23B illustrate features in the region 50N. However, the structures illustrated in FIGS. 22A through 23B may be applicable to both the region 50N and the region 50P. As discussed previously, the difference between the region 50N and the region 50P is the presence of the second work function layer 100 in the region 50P.

Figure 22B:
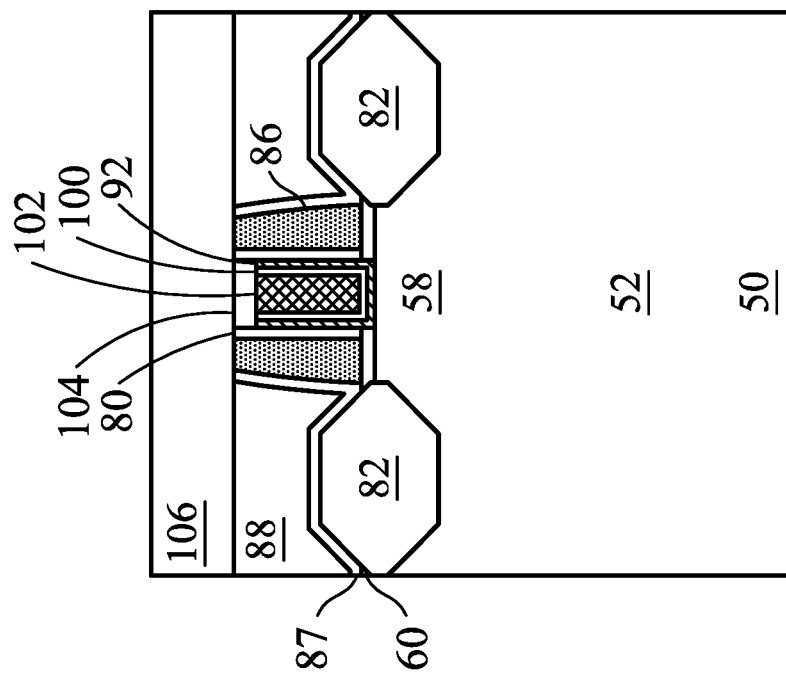
Figure 22A:
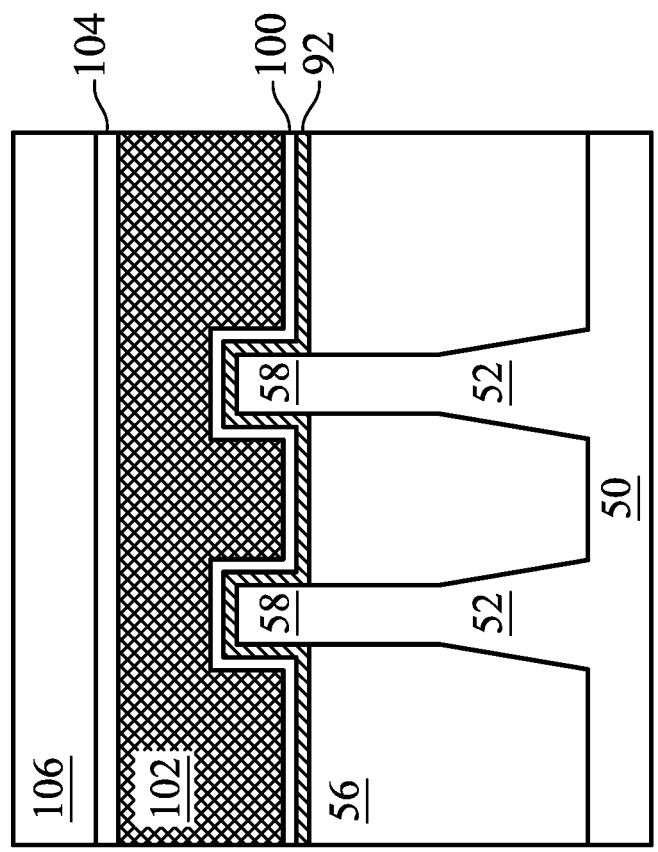

In FIGS. 22A and 22B, a second ILD 106 is deposited over the first ILD 88. In some embodiments, the second ILD 106 is a flowable film formed by a flowable CVD method. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate stack (including the gate dielectric layer 92 and a corresponding overlying gate electrode 102) is recessed, so that a recess is formed directly over the gate stack and between opposing portions of the gate seal spacers 80, as illustrated in FIGS. 22A and 22B. A gate mask 104 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 108 (discussed below with respect to FIGS. 23A and 23B) penetrate through the gate mask 104 to contact the top surface of the recessed gate electrode 102.

Figure 23B:
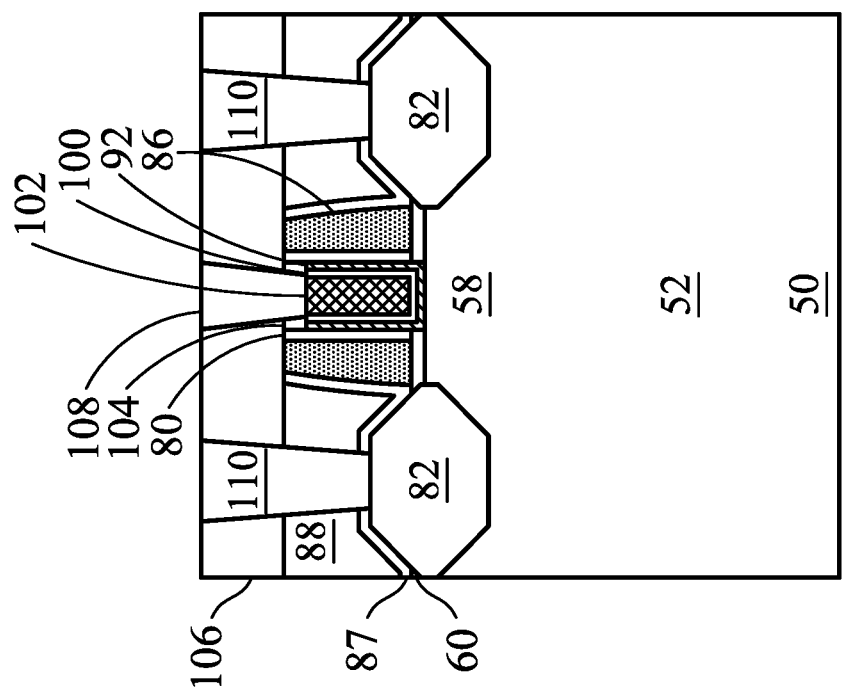
Figure 23A:
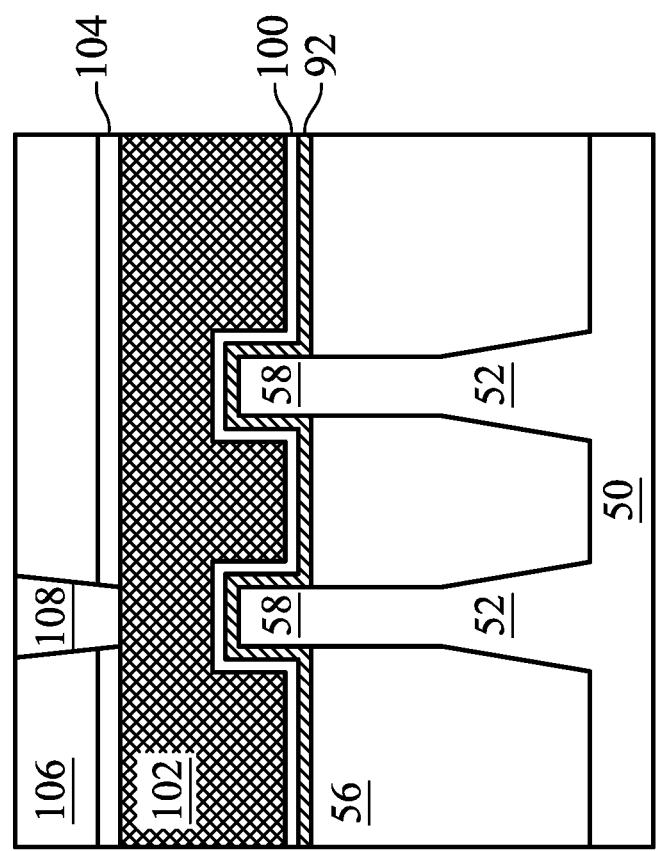

In FIGS. 23A and 23B, gate contacts 108 and source/drain contacts 110 are formed extending through the second ILD 106 and the first ILD 88, in accordance with some embodiments. Openings for the source/drain contacts 110 are formed through the second ILD 106 and the first ILD 88, and openings for the gate contact 108 are formed through the second ILD 106 and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 110 and gate contacts 108 in the openings. An anneal process may be performed to form a silicide at an interface between the epitaxial source/drain regions 82 and the source/drain contacts 110. The source/drain contacts 110 are physically and electrically coupled to the epitaxial source/drain regions 82, and the gate contacts 108 are physically and electrically coupled to the gate electrodes 102. The source/drain contacts 110 and the gate contacts 108 may be formed in different processes, or may be formed in the same process. Although FIG. 23B illustrates the source/drain contacts 110 and the gate contacts as being formed in the same cross-sections, it should be appreciated that each of the source/drain contacts 110 and the gate contacts 108 may be formed in different cross-sections, which may avoid shorting of the contacts.

Forming semiconductor devices according to the above-described methods, including exposing the first work function layer 94 to the plasma treatment, increases the density of the first work function layer 94, reduces grain size in the first work function layer 94, reduces the concentration of carbon in the first work function layer 94, increases the concentrations of nitrogen and tungsten in the first work function layer 94, decreases the ratio of tungsten to nitrogen in the first work function layer 94, and improves adhesion of the BARC layer 96 to the first work function layer 94. This improves patterning accuracy of the first work function layer 94, reduces defects in the semiconductor devices, increases semiconductor device yield, and improves performance in the semiconductor devices. Moreover, depositing and patterning work function layers according to the above-described embodiments allows for multi-threshold voltage ($V_{th}$) gate to be formed, which may be used in electronic components, such as transistors. Including a multi-threshold voltage gate allows for speed, delay, and power to be optimized in a semiconductor device.

In accordance with an embodiment, a method includes forming a semiconductor fin extending from a substrate; depositing a dielectric layer over the semiconductor fin; depositing a first work function layer over the dielectric layer; and exposing the first work function layer to a metastable plasma of a first reaction gas, a metastable plasma of a generation gas, and a metastable plasma of a second reaction gas, the first reaction gas being different from the second reaction gas. In an embodiment, the method further includes depositing a bottom anti-reflective coating layer in physical contact with the first work function layer after the exposing the first work function layer to the metastable plasmas. In an embodiment, the method further includes depositing a photoresist layer over the bottom anti-reflective coating layer; patterning the photoresist layer to form a patterned photoresist layer; etching the bottom anti-reflective coating layer to expose the first work function layer using the patterned photoresist layer as a mask; etching the first work function layer to expose the dielectric layer using the bottom anti-reflective coating layer as a mask; removing the bottom anti-reflective coating layer and the patterned photoresist layer; and forming a second work function layer over the dielectric layer and the first work function layer. In an embodiment, the etching the first work function layer is performed using an etchant including ammonia. In an embodiment, the second work function layer includes silicon, carbon, or aluminum. In an embodiment, the depositing the first work function layer includes depositing a tungsten carbon nitride (WCN) material. In an embodiment, the method further includes generating a first metastable plasma from the first reaction gas and the generation gas; and after generating the first metastable plasma, generating a second metastable plasma from the first metastable plasma and the second reaction gas. In an embodiment, the first reaction gas includes nitrogen, the generation gas includes helium, and the second reaction gas includes hydrogen.

In accordance with another embodiment, a method includes generating a first plasma from a first precursor gas, the first precursor gas including helium; separating charged species in the first plasma from metastable species in the first plasma; mixing the metastable species with a second precursor gas, the second precursor gas including hydrogen, the mixing the first plasma with the second precursor gas generating a second plasma; and exposing a work function layer on a substrate to the second plasma. In an embodiment, the first precursor gas further includes nitrogen, a flowrate of nitrogen in the first precursor gas being from 1,000 to 9,000 sccm, a flowrate of helium in the first precursor gas being from 1,000 to 9,000 sccm, and a flowrate of hydrogen in the second precursor gas being from 1,000 to 4,500 sccm. In an embodiment, the generating the first plasma is performed in a plasma generation chamber with a temperature from 100° C. to 300° C. and a pressure from 1 Torr to 2 Torr using a radio frequency (RF) power from 1,000 W to 3,000 W. In an embodiment, the separating the charged species in the first plasma from the metastable species in the first plasma is performed at least in part using a meta-stable activated radical strip (MARS) showerhead. In an embodiment, the mixing the metastable species with the second precursor gas is performed in a plasma generation chamber disposed between the showerhead and the substrate, the metastable species being flowed through a first plurality of openings in the showerhead, and the second precursor gas being flowed through a second plurality of openings in the showerhead separate from the first plurality of openings. In an embodiment, the work function layer includes tungsten carbon nitride (WCN) before the exposing the work function layer to the second plasma, and the exposing the work function layer to the second plasma reduces an atomic concentration of carbon in the work function layer to less than 0.1 percent. In an embodiment, the exposing the work function layer to the second plasma increases a density of the work function layer to at least 10.8 g/cm$^3$.

In accordance with yet another embodiment, a semiconductor device includes a fin extending from a substrate; a dielectric layer over the fin; a first work function layer over the dielectric layer, the first work function layer including tungsten, nitrogen, and helium, the first work function layer having a nonzero atomic concentration of carbon less than 0.1%; a second work function layer over the dielectric layer and the first work function layer, the second work function layer contacting the dielectric layer in a first region and the first work function layer in a second region; and a gate electrode over the first work function layer and the second work function layer. In an embodiment, the first work function layer has a density from 9.4 g/cm$^3$ to 12.0 g/cm$^3$. In an embodiment, the second work function layer includes aluminum, carbon, or silicon. In an embodiment, a ratio of tungsten to nitrogen in the first work function layer is less than 1.20. In an embodiment, the first work function layer has an atomic concentration of nitrogen from 9.2% to 15.0%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin extending from a substrate;
   depositing a dielectric layer over the semiconductor fin;
   depositing a work function layer over the dielectric layer;
   generating a plasma, wherein the plasma is free of charged species; and
   exposing the work function layer to the plasma.

2. The method of claim 1, wherein generating the plasma further comprising generating the plasma using an excitation gas and removing the charged species by reacting the plasma using a reaction gas.

3. The method of claim 2, wherein the excitation gas comprises nitrogen and helium.

4. The method of claim 2, wherein the reaction gas comprises hydrogen.

5. The method of claim 1, wherein exposing the work function layer to the plasma increases a density of the work function layer.

6. The method of claim 1, wherein exposing the work function layer to the plasma increases a nitrogen concentration in the work function layer.

7. The method of claim 1, wherein exposing the work function layer to the plasma decreases a carbon concentration in the work function layer.

8. The method of claim 1, further comprising:
   depositing a bottom anti-reflective coating layer on the work function layer after exposing the work function layer to the plasma;
   patterning the bottom anti-reflective coating layer to expose a portion of the work function layer;
   etching the exposed portion of the work function layer to expose a portion of the dielectric layer;
   removing the bottom anti-reflective coating layer; and
   forming a second work function layer on the exposed portion of the dielectric layer and the work function layer.

9. A method comprising:
   generating a first metastable plasma from a first precursor gas;
   mixing the first metastable plasma with a second precursor gas, the second precursor gas comprising hydrogen, wherein the mixing the first metastable plasma with the second precursor gas generates a second metastable plasma different from the first metastable plasma; and
   exposing a work function layer on a semiconductor fin to the second metastable plasma.

10. The method of claim 9, wherein the first precursor gas comprises nitrogen and helium.

11. The method of claim 9, wherein the work function layer comprises tungsten carbon nitride.

12. The method of claim 11, after exposing the work function layer to the second metastable plasma, the work function layer has a nonzero atomic concentration of carbon less than 0.1%.

13. The method of claim 9, after exposing the work function layer to the second metastable plasma, the work function layer has a density from 9.4 g/cm$^3$ to 12.0 g/cm$^3$.

14. The method of claim 9, after exposing the work function layer to the second metastable plasma, a ratio of tungsten to nitrogen in the work function layer is less than 1.2.

15. The method of claim 9, wherein the mixing the first metastable plasma with the second precursor gas removes charged species from the first metastable plasma.

16. A method of forming a semiconductor device, the method comprising:
   forming a first fin extending from a substrate;
   depositing a dielectric layer over the first fin;
   forming a first work function layer over the dielectric layer, wherein the first work function layer comprises tungsten, nitrogen, and helium; and
   forming a gate electrode over the first work function layer.

17. The method of claim 16, further comprising:
   forming a second fin extending from the substrate, wherein depositing the dielectric layer over the first fin further deposits the dielectric layer over the second fin; and
   removing the first work function layer over the first fin while keeping the first work function layer over the second fin intact.

18. The method of claim 17, further comprising forming a second work function layer on the dielectric layer over the first fin and on the first work function layer over the second fin.

19. The method of claim 18, wherein the second work function layer comprises aluminum, carbon, or silicon.

20. The method of claim 16, wherein the first work function layer has an atomic concentration of nitrogen from 9.2% to 15.0%.

* * * * *